United States Patent [19]

Eguchi et al.

[11] Patent Number: 5,359,204
[45] Date of Patent: Oct. 25, 1994

[54] SWITCHING DEVICE

[75] Inventors: Ken Eguchi, Atsugi; Kunihiro Sakai, Yamato; Haruki Kawada, Atsugi; Hiroshi Matsuda, Yokohama; Yuko Morikawa, Kawasaki; Takashi Nakagiri, Tokyo; Takashi Hamamoto, Yokohama; Masaki Kuribayashi, Inagi, all of Japan

[73] Assignee: Canon Kabushiki Kaisha, Tokyo, Japan

[21] Appl. No.: 964,481

[22] Filed: Oct. 21, 1992

Related U.S. Application Data

[63] Continuation of Ser. No. 662,389, Feb. 19, 1991, abandoned, which is a continuation of Ser. No. 106,271, Oct. 9, 1987, abandoned.

[30] Foreign Application Priority Data

| Oct. 13, 1986 | [JP] | Japan | 61-243684 |
| Dec. 24, 1986 | [JP] | Japan | 61-309431 |
| May 27, 1987 | [JP] | Japan | 62-133157 |

[51] Int. Cl.$^5$ .......................................... H01L 49/02
[52] U.S. Cl. ............................................ 257/2; 257/4; 257/40
[58] Field of Search ................................ 257/2, 4, 1, 40

[56] References Cited

U.S. PATENT DOCUMENTS

| 3,748,501 | 7/1973 | Fritzsche et al. | 307/299 |
| 3,953,874 | 4/1976 | Aviram et al. | 357/8 |
| 4,127,738 | 11/1978 | Ghosh et al. | 136/89 NB |
| 4,371,883 | 2/1983 | Potember et al. | 357/8 |
| 4,510,089 | 4/1985 | Hotta et al. | 260/396 |
| 4,534,015 | 8/1985 | Wilson | 365/106 |
| 4,586,062 | 4/1986 | Bouffard et al. | 357/5 |
| 4,665,412 | 5/1987 | Ohkawa et al. | 357/6 |
| 4,740,396 | 4/1988 | Uekita et al. | 427/434.3 |

FOREIGN PATENT DOCUMENTS 3242712 5/1984 Fed. Rep. of Germany.

OTHER PUBLICATIONS

Sze, S. M., *Physics Of Semiconductor Devices*, 2nd ed., John Wiley, 1981, pp. 402–407.
Hayashi, Y., "Switching Phenomena . . . " Appl. Phys. Lett. 15 Aug. 1980 pp. 407–408.
Roberts, G. G, et al. "AC and DC conduction in lightly substituted anthracene . . . " Thin Solid Films, vol. 68, 1980 pp. 223–232.
Glinka N., *General Chemistry*, MIR Publishers 1970, pp. 524–525.
Vincett, P. S., and Roberts, G. G., "Electrical and Photoelectrical Transport . . . " Thin Solid Films, 68, 1980 pp. 135–171.
Kuhn, H., "Functionalized Monolayer Assembly Manipulation" Thin Solid Films, 99, 1983 pp. 1–6.
Kuroda, Shin-Ichi et al., "Electron Spin Resonance In Langmuir Films . . . " Thin Solid Films, 99, 1983 pp. 21–24.
Bubeck, C. et al. Thin Solid Films, 99, 1983, pp. 103–107
Ruaudel-Teixier et al. Thin Solid Films, 99, 1983, pp. 33–40.
Fox, "Molecular Electronic Devices Offer Challenging Goal", Chemical Engineering News, May 23, 1983, pp. 27–29.
Chiang, C., App. Phys. Ltrs, 31 No. 9 (1977) pp. 553–555.
Fulop, et al., Elec. Ltrs, 21 No. 10 (1985) pp. 439–441.
Belbeoch et al., Thin Solid Films 134 No. 1–3 (1985) pp. 89–99.
Sugi, J. Mol. Elec. 1, No. 1 (1985) pp. 3–17.
Sugi, Japan J. Appl. Phys. Suppl. (1983) pp. 181–184.
Nakahara, et al. Thin Solid Films, 133 No. (1–4) (1985) pp. 1–10.
Couch et al., Thin Solid Film, vol. 135 (1986), pp. 173–182.

Primary Examiner—Sara W. Crane
Attorney, Agent, or Firm—Fitzpatrick, Cella Harper & Scinto

[57] ABSTRACT

A switching device is characterized by having periodical layer structure of an organic insulator between a pair of electrodes and having memorizability with respect to switching characteristic. The layer structure is formed of an amphiphilic compound according to the LB method.

72 Claims, 8 Drawing Sheets

SWITCHING DEVICE

This application is a continuation of application Ser. No. 07/662,389 filed Feb. 27, 1991, now abandoned, which is a continuation of application Ser. No. 07/106,271 filed Oct. 9, 1987, now abandoned.

BACKGROUND OF THE INVENTION

1. Field of the Invention

This invention relates to a MIM element having an organic insulating layer, namely a metal-insulation-metal (MIM) structure switching device characterized in that said organic insulating layer has a periodical layer structure, and also to a three-terminal device having said MIM structure switching device.

2. Related Background Art

Recently, there is an increasing interest in molecular electronics, particularly with regard to attempts to apply the functioning of organic molecules to electronic devices, etc. Accordingly, studies on the Langmuir-Blodgett film (LB film) to construct molecular electronic devices have been made actively pursued. The LB film is formed by laminating organic molecule layers regularly one by one, and the film thickness can be controlled at a level of molecular length. Since a uniform and homogeneous ultra-thin film can therefore be formed, there have been frequent attempts to use this as an insulating film. For example, there are a tunnel bonding element with metal-insulator-metal (MIM) structure) [G. L. Larkins et al., "Thin Solid Films", Vol. 99 (1983)]; emission element with metal-insulator-semiconductor (MIS) structure [G. C. Roberts et al., "Electronics Letters", Vol. 29, pp. 489 (1984)]; and switching element [N. J. Thomas et al., "Electronics Letters", Vol. 20, pp. 838 (1984)] have been described.

Although device characteristics have been investigated according to these studies, deficiencies in reproducibility and stability such as a variance in characteristics for each element and changes over time still exist.

In the prior art, investigations as mentioned above have been progressed primarily with respect to LB film of fatty acid, which can be handled relatively easily. However, recently, organic materials which can overcome the drawbacks of inferior heat resistance and mechanical strength of the prior art films are successively being developed.

SUMMARY OF THE INVENTION

It is an object of the present invention to provide a novel switching device free from the drawbacks in the conventional switching devices having a LB film.

It has been found that non-linear type current-voltage characteristics, which differ from those of the MIM element known in the art, are obtained by laminating periodically molecules having a group of relatively greater $\pi$ electron level and a group having $\delta$ electron level and then passing current in the direction parallel to the periodical direction in an organic insulator thus prepared having a periodical structure of electrical potential; further a novel switching phenomenon in electroconduction is observed when a sandwich structural device, in which a LB film formed of the above molecules is sandwiched between conductive materials such as a metal (the device being called a MIM structure or MIM element because of this structure), in respect of various characteristics such as material characteristics, electrical characteristics and the like. Based on these, the foregoing and other objects of the present invention have been attained.

According to one aspect of the present invention, there is provided a switching device, characterized by having a periodical layer structure of an organic insulator between a pair of electrodes and having memorizability with respect to switching characteristic.

According to a further aspect of the present invention, there is provided a switching device, comprising a periodical layer structure of an organic insulator between a pair of electrodes, said layer being a mixed monomolecular film or a mixed monomolecular built-up film of an amphiphilic compound having a hydrocarbon chain of a polymer compound having a hydrophobic region and a hydrophilic region and a molecule having an electron conjugated system.

According to another aspect of the present invention, there is provided a switching device, comprising a pair of electrodes and a periodical layer of an insulating or semiconductive organic material between said pair of electrodes, and means fop applying electrical signals fop controlling the switching characteristics of said switching device.

DETAILED DESCRIPTION OF THE PREFERRED EMBODIMENTS

Figure 1:
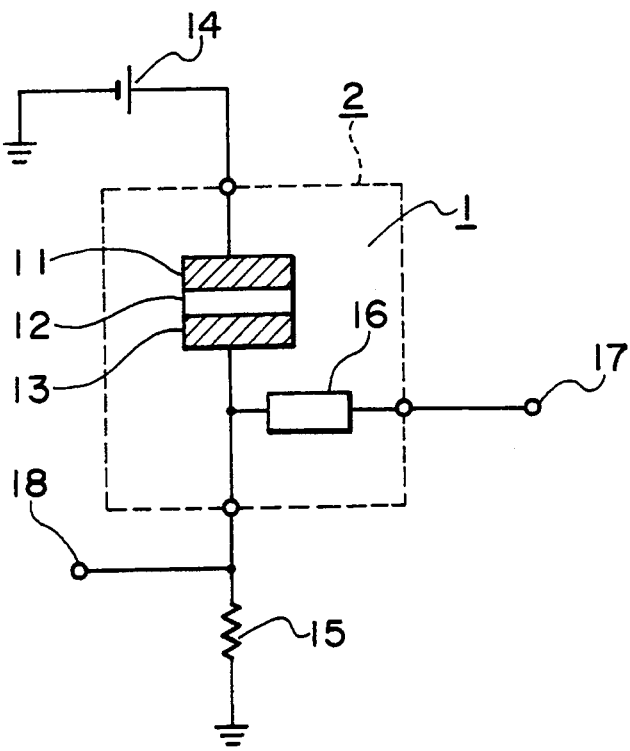
FIG. 1 is a schematic illustration of the switching device of the present invention.

Generally, since most of organic materials exhibit insulating or semi-insulating characteristics, a remarkable diversity of organic materials may be found for the organic material having a group having $\pi$ electron level applicable to the present invention.

A dye having suitable $\pi$ electron system for the present invention may include, dyes having porphyrin structure such as phthalocyanine, tetraphenyl-porphyrin, etc.; azulene dyes having a squarillum group and a croconicmethine group as a bonding chain and cyanine-like dyes having two nitrogen-containing heterocyclic groups such as quinoline, benzothiazole and benzoxazole bonded through a squarillum group and a croconicmethine group and a cyanine dye, a fused polycyclic aromatic compounds such as anthracene and pyrene; chain compounds comprising a polymer of aromatic rings and heterocyclic compounds; polymers of diacetylenic groups; further tetraquinodimethane or tetrathiafulvalene derivatives and analogs thereof and charge transfer complexes thereof; and further metal complex compounds such as ferrocene, trisbipyridyl-lutenium complexes, etc.

For formation of the organic insulating layer, it is specifically possible to apply the vapor deposition method or the cluster ion beam method, but the LB method is particularly suitable among the known prior art techniques because of its controllability, easiness and reproducibility.

According to the LB method, a monomolecular film of its built-up film of an organic compound having a hydrophobic region and a hydrophilic region in one molecule can be easily formed on a substrate, whereby it is possible to supply organic ultra-thin films which have a thickness of molecular order and are also uniform and homogeneous over a large area.

The LB method is a method in which a monomolecular film or a built-up film is prepared by utilizing the phenomenon that, in a molecule with a structure having a hydrophilic region and a hydrophobic region, when the balance between them (the (amphiphilic balance) is adequately maintained, the molecule becomes a monomolecular film on a water surface with the hydrophilic region directed downward.

As a group constituting the hydrophobic region, there may be included various hydrophobic groups such as saturated and unsaturated hydrocarbon groups or fused polycyclic aromatic groups and chain polycyclic phenyl groups which have been generally known widely in the art. These may constitute the hydrophobic moiety either individually or as a combination of a plurality thereof. On the other hand, the most typical constituent of the hydrophilic moiety may include, hydrophilic groups such as a carboxyl group, an ester group, an acid amide group, an imide group, a hydroxyl group and further amino groups (primary, secondary, tertiary and quaternary), etc. These also constitute the hydrophilic moiety of the above molecule individually or as a combination of a plurality thereof.

Dye molecules having these hydrophobic and hydrophilic groups in combination with good balance and also a π electron system with an appropriate size can form a monomolecular film on water surface, and can be extremely suitable materials for the present invention.

Specific examples may include the molecules as shown below.

[I] Croconicmethine Dyes

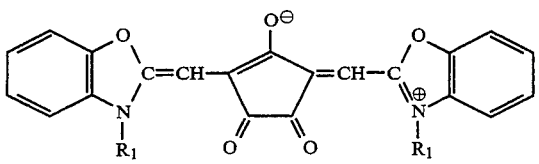

1)

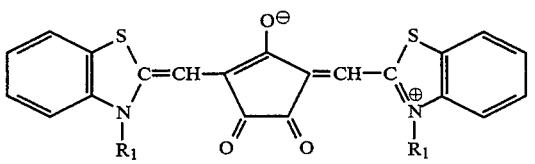

2)

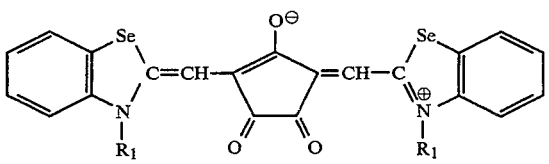

3)

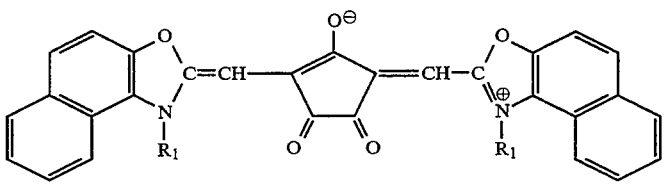

4)

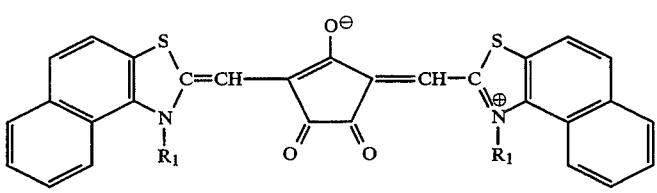

5)

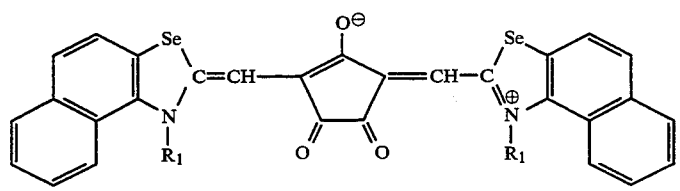
6)

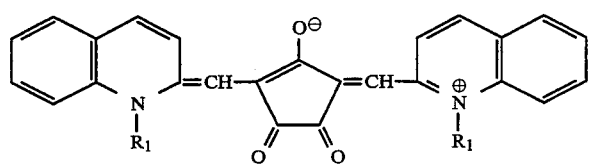
7)

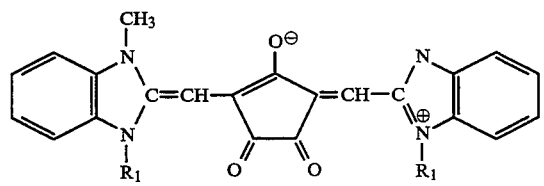
8)

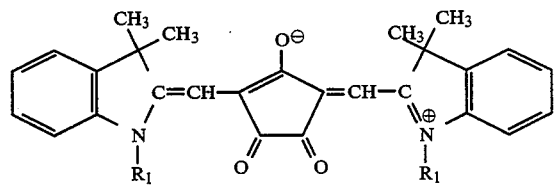
9)

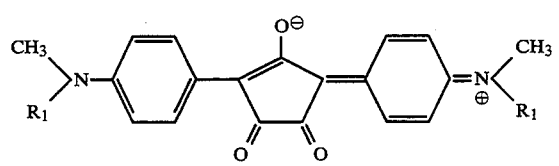
10)

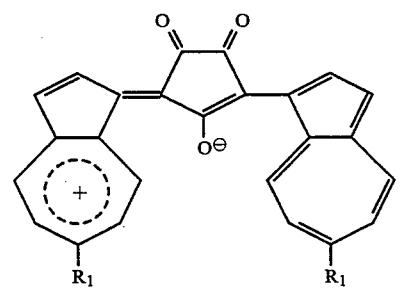
11)

Here, $R_1$ corresponds to the group having $\nu$ electron level, and also it is a long chain alkyl group introduced in order to make formation of monomolecular film on the water surface easier, its carbon number n being suitably $5 \leq n \leq 30$. Concerning the compounds mentioned above as a specific example only their basic structures are shown, and various substituted derivatives of these compounds are also suitable in the present invention, as a matter of course. [II] Squarilium Dyes The compounds as mentioned in [I] of which croconicmethine groups are replaced with squarilium group having the following structure.

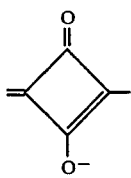

[III] Porphyrin Dye Compounds

1)

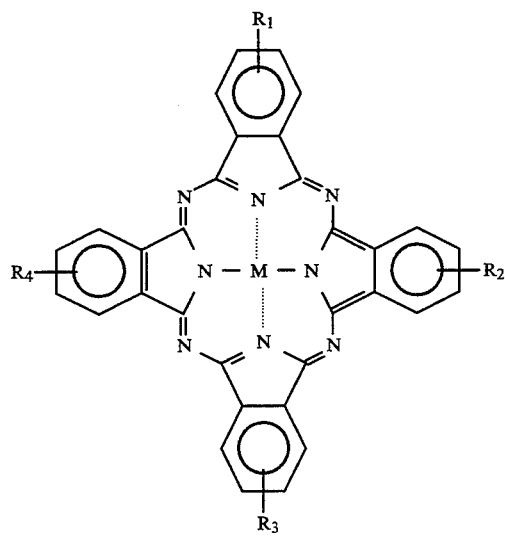

$R_1, R_2, R_3, R_4 =$ H, 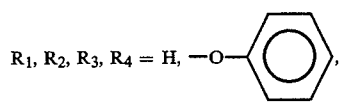,

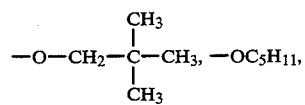, $-OC_5H_{11}$, $-O(CH_3)_3$, $-CH_2NHC_3H_7$

M = H₂, Cu, Ni, Al—Cl and a rare earth metal ion

2)

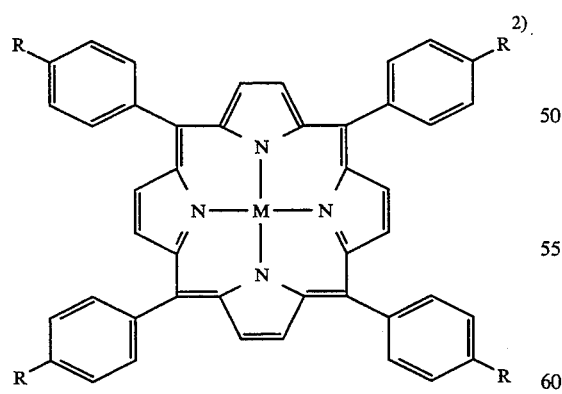

R = OCH(COOH) $C_nH_{2n+1}$ $5 \leq n \leq 25$

M = H₂, Cu, Ni, Zn, Al—Cl and a rare earth metal ion

3)

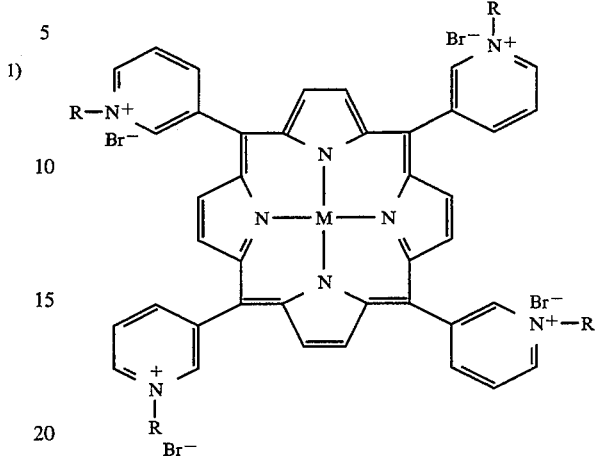

R = $C_nH_{2n+1}$ $5 \leq n \leq 25$

M = H₂, Cu, Ni, Zn, Al—Cl and a rare earth metal ion

R is introduced for making formation of monomolecular film easier, and it is not limited to the substitutents mentioned here. Also, R₁-R₄, and R correspond to the groups having ν electron level as mentioned above.

[IV] Fused Polycyclic Aromatic Compounds

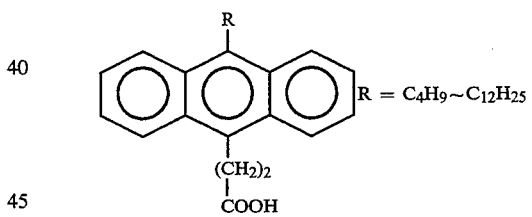

R = $C_4H_9 \sim C_{12}H_{25}$

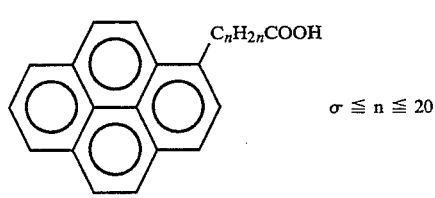

$\sigma \leq n \leq 20$

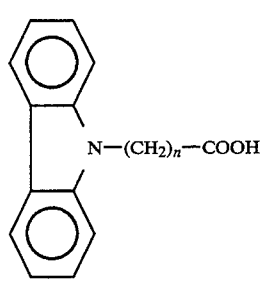

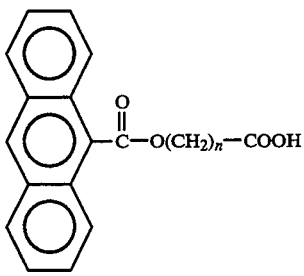

[V] Diacetylene Compounds

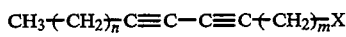

$0 \leq n, m \leq 20$
and simultaneously $n + m > 10$

X is a hydrophilic group, and generally —COOH is used, and —OH, —CONH$_2$, etc. can be also used. [CII] Others

1)

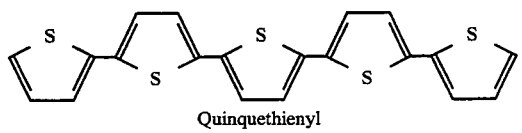

Quinquethienyl

2)

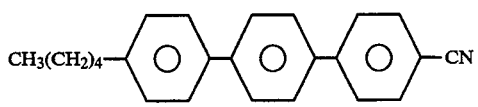

3)

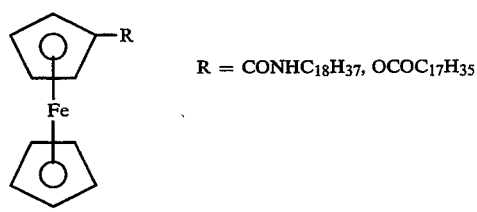

R = CONHC$_{18}$H$_{37}$, OCOC$_{17}$H$_{35}$

4)

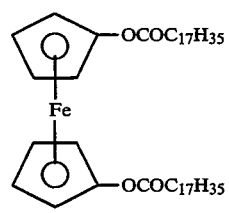

5)

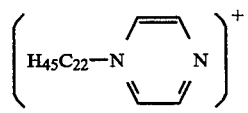

6)

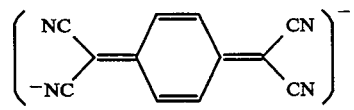

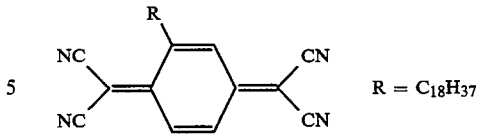

R = C$_{18}$H$_{37}$

Other than those mentioned above, dye materials suitable for the LB method are also suitable for the present invention, as a matter of course. For example, biological materials (e.g. bacteriorodopsin or cytochrome c) or synthetic polypeptides (e.g. PBLG, etc.) which have been recently studied are also applicable. Such amphiphilic molecules form a monomolecular layer on the water surface with hydrophilic groups directed downward. The monomolecular layer on the water surface has the characteristics of the two-dimensional system. When the molecules are scattered sparsely, the following formula of the two-dimensional ideal gas is valid between the area A per one molecule and the surface pressure $\pi$:

$$\pi A = KT,$$

thus becoming gas film". Here, K is the Bolzmann's constant and T is an absolute temperature. When A is made sufficiently small, intermolecular interactions are strengthened, whereby the molecules become a "condensed film (or solid film)" of a two-dimensional solid. The condensed films can be transferred one layer by one layer onto the surface of a substrate such as glass. By use of this method, a monomolecular film or its built-up film can be formed, which can be used as the insulating layer having a periodical layer structure for the switching device of the present invention.

Specific preparation may be shown for example, the following method.

Figure 8:
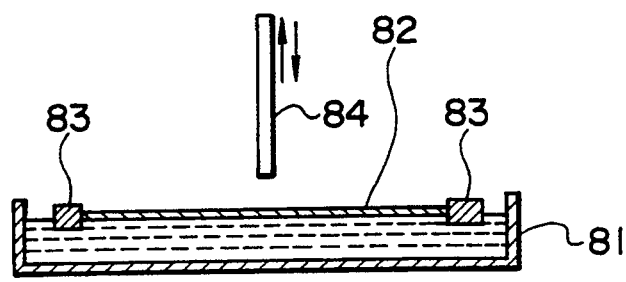
FIG. 8 is a schematic illustration of the method for forming the organic dye insulating layer of the present invention according to the LB method.

A desired organic compound is dissolved in a solvent such as chloroform, benzene, acetonitrile, etc. Then, by use of an appropriate device as shown in FIG. 8, such solution is spread over the aqueous phase 81 to form the organic compound in shape of a film.

Figure 9A:
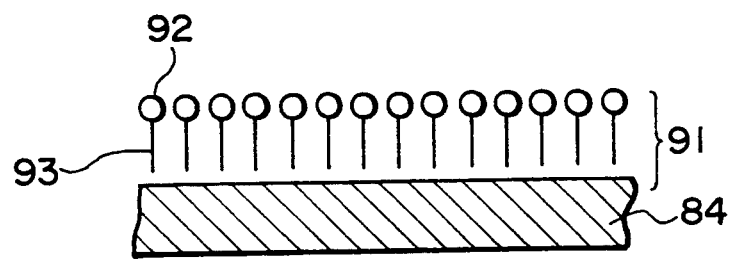
FIG. 9a and FIG. 9b are schematic illustrations of monomolecular films.

Next a partitioning plate (or a buoy) is provided to prevent too broad expansion of the spreading layer 82 through free diffusion on the aqueous phase 81, whereby the area of the spreading layer 82 is restricted to control the gathered state of the film material and obtain a surface pressure in proportion to the gathered state. By moving the partitioning plate 83, the gathered state of the film substance can be controlled by reducing the spreading area, whereby the surface pressure can be gradually elevated to be set at a surface pressure $\pi$ suitable for preparation of the film. While maintain a constant surface pressure a clean substrate 84 is gently moved vertically up and down to transfer monomolecular films of the organic compound onto the substrate 84. Such monomolecular film 91 is a film in which molecules are arranged orderly as schematically shown in FIG. 9a or 9b.

The monomolecular film 91 can be thus produced and a built-up film having a desired built-up number of monomolecular layers can be formed by repeating the above procedure. For transfer of the monomolecular film 91 onto the substrate 84, other than the above vertical dipping method, such methods as the horizontal lifting method, the rotating cylinder method, etc. may be employed. The horizontal lifting method is a method in which transfer is effected with the substrate being contacted horizontally with the water surface, and the rotating cylinder method is a method in which the monomolecular layer is transferred onto the substrate surface by rotating a cylindrical substrate on the water surface.

Figure 9B:
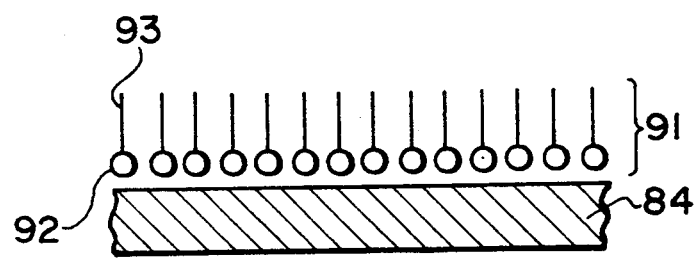
Figure 10A:
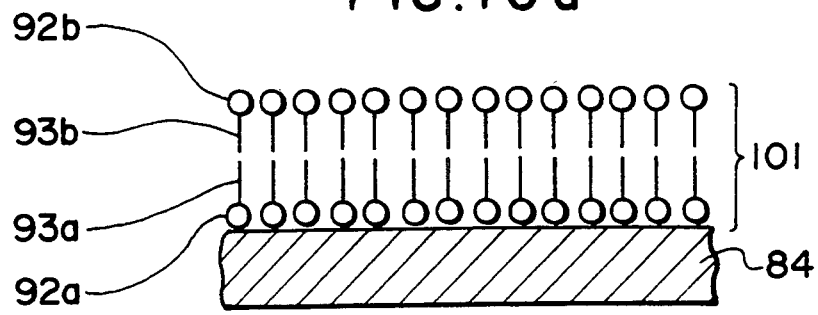
FIG. 10a, FIG. 10b and FIG. 10c are schematic illustrations of built-up films.
Figure 10B:
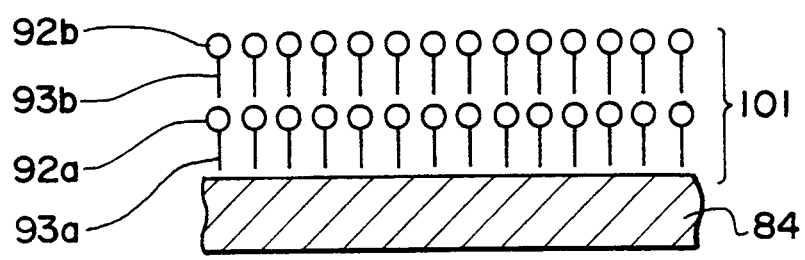
Figure 10C:
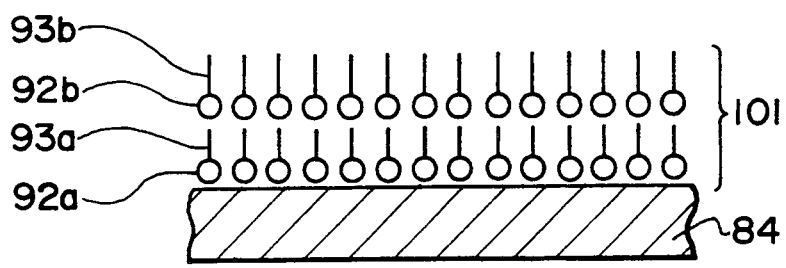

In the vertical dipping method as described above, when a substrate having a hydrophilic surface is withdrawn in the direction transversing the water surface, a monomolecular layer 91 with the hydrophilic sites 92 of the organic compound faced toward the substrate 84 side is formed on the substrate (FIG. 9b). When the substrate is moved vertically up and down, monomolecular films 91 are laminated one layer by one layer in the respective steps to form the built-up film 101 (FIG. 10). Since the molecule directions of films formed in the withdrawing step and the dipping step are opposite to each other, according to this method there is formed a Y type film in which hydrophobic sites 93a and 93b of the organic compound are faced to each other between the respective layers of monomolecular films (FIG. 10a). In contrast, according to the horizontal lifting method, a monomolecular film 91 with the hydrophobic sites 93 of the organic compound being faced toward the substrate 84 side is formed on the substrate 84 (FIG. 9a). According to this method, even when the monomolecular film 91 may be built up, there is no change in the molecule directions of the film formed, but there is formed an X type film in which the hydrophobic sites 93a and 93b are faced toward the substrate 84 side in all of the layers (FIG. 10b). On the contrary, a built-up film in which the hydrophilic groups 92a and, 92b in all the layers are faced toward the substrate 84 side is called a Z type film (FIG. 10c).

The method for transferring monomolecular film 91 onto the substrate 84 is not limited to the above methods, and it is also possible to employ a method in which a substrate is extruded into an aqueous phase from a roll, when employing a large area substrate. Also, the direction of the hydrophilic group and hydrophobic group toward the substrate as described above are given as general rules, and it can be also modified by the surface treatment of the substrate, etc.

As described above, the potential barrier layer comprising the monomolecular film 91 or its built-up film 101 is formed on the substrate 84.

Also, a MIM element comprising the following constitution as the novel MIM element of the present invention has been found to have excellent switching memory function.

That is, it is a switching device, having a layer in which there is periodically formed mixed monomolecular films or a mixed monomolecular built-up film of an amphiphilic compound having a hydrocarbon chain or a polymeric compound having a hydrophobic region and a hydrophilic region in combination and a molecule having $\pi$ electron conjugated system, the layer being sandwiched between a pair of electrodes.

Generally, since most of organic materials exhibit insulating or semi-insulating characteristics, a remarkable diversity of organic materials may be found for the organic material applicable to the above MIM element.

The molecule having the electron system as mentioned in the above MIM element may include dyes having porphyrin structure such as phthalocyanine, tetraphenylporphylline, etc.; azulene dyes having squarilium group and croconicmethine group as a bonding chain and cyanine-like dyes having two nitrogen-containing heterocyclic groups such as quinoline, benzothiazole and benzoxazole bonded through a squarilium group and a croconicmethine group and a cyanine dye; a fused polycyclic aromatic compound such as anthracene and pyrene; chain compounds comprising a polymer of aromatic rings and heterocyclic compounds ; polymers of diacetylenic groups; further tetraquinodimethane or tetrathiafulvalene derivatives and analogs thereof and charge transfer complexes thereof; and further metal complex compounds such as ferrocene, trisbipyridyllutenium complexes, etc.

Also, as the amphiphilic compound having a hydrocarbon chain, the following compounds may be included. The most typical constituent of the hydrophobic moiety of such amphiphilic compound is an alkyl group, and both straight and branched alkyl groups may be available. As other groups constituting the hydrophobic moiety, there may be included olefinic hydrocarbon groups such as vinylene, vinylidene, acetylene, etc., phenyl groups, etc. These may be used individually or as a combination of a plurality of groups to constitute the hydrophobic moiety. On the other hand, the most typical constituent of the hydrophilic moiety are, for example, hydrophilic groups such as a carboxyl group, a sulfonic acid group and a quaternary amino group. Such amphiphilic compound has these hydrophobic and arachidic acid, stearic acid, omega-tricosenoic acid, diacetylene, etc. may be included. Also, the amphiphilic compound having a hydrocarbon chain of the present invention may be an amphiphilic compound having unsaturated bond in a part or all of the hydrocarbon skelton, which may also have particularly a substituent such as fluorine, etc. at said unsaturated bond region.

The polymeric compound having a hydrophobic group and a hydrophilic group in combination, after film formation, may be polymerized to stabilize the film. Specific examples of the polymeric compound may include those as set forth below.

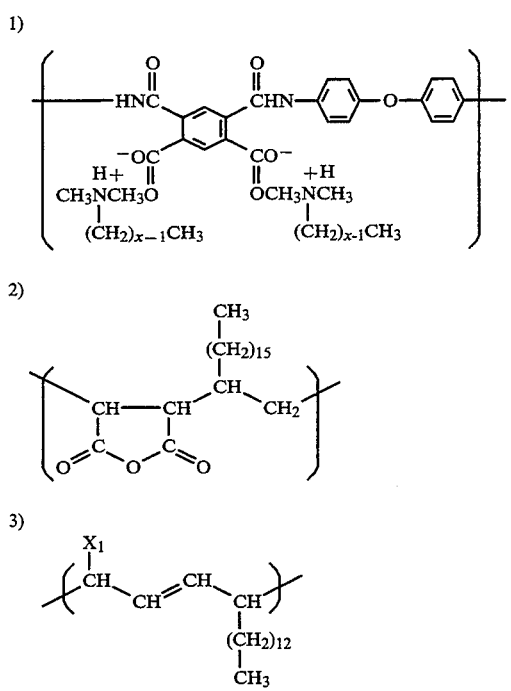

Also for formation of the above MIM element, the LB method as described above is applicable.

In the above MIM element, since a LB film is formed by mixing of an amphiphilic compound with a molecule having $\pi$ electron conjugated system, and therefore it is rendered possible to form a molecule having H electron conjugated system into a LB film as the single substance, even when the molecule alone have not been formed into a LB film.

In the present invention, the substrate 84 for supporting the thin film formed by lamination of inorganic or organic material as described above may be any of metal, glass, ceramics, plastic materials, etc., and further a biological material with remarkably low heat resistance can be also used.

The substrate 84 as described above may be in any desired shape, preferably a flat plate, but it is not limited to flat plate at all. This is because, in the film forming method as described above, there is the advantage that the film can be formed in accordance with any shape of the surface of the substrate.

Also, according to the LB method, the layer thickness of the insulating layer can be controlled freely at the molecular size order. In the present invention, switching characteristic is exhibited also in the product with a layer thickness of several Å to several thousands Å, and such product having a layer thickness in the range of 10Å to 1000Å is preferred.

On the other hand, the electrode material having such LB film sandwiched therebetween may be one having high conductivity, as exemplified by a large number of materials, including metals such as Au, Pt, Ag, Pd, Al, In, Sn, Pb, etc. or alloys of these, further Graphite or silicide, and further electroconductive oxides such as ITO, etc. As the method for formation of electrodes by use of such materials, thin film techniques known in the art may be sufficiently applicable. It should be noted here that preparation or treatment step requiring, for example, high temperature ($>100°$ C.) should be desirably avoided during further formation of electrodes on the LB film already formed so that no damage may be given to the LB layer. Also, a large number of metal materials, typically Al, In, are Generally subjected to formation of oxidized film on the surface when exposed in air, etc. after formation as the electrode. As the material for the electrode which becomes the underlayer with respect to the LB film, an electroconductive material which does not form an insulating oxidized film, such as a noble metal or oxide conductor such as ITO may be preferably used.

The present invention is described in detail by referring to the following Examples.

Example 1

On a glass substrate (#7509, produced by Corning Co.) subjected to hydrophobic treatment by being left to stand overnight in saturated vapor of hexamethyldisilane (HMDS), Cr was deposited as the underlayer to a thickness of 500Å according to the vacuum vapor deposition method, and further Au was vapor deposited (film thickness 1000Å) according to the same method to form base electrodes 13 (FIG. 5) in shape of stripe with a width of 1 mm. With such a substrate as the carrier, monomolecular films of squarilium-bis-6-octyl azulene (SOAZ) were built up. The details of the build-up method are described below.

Figure 5:
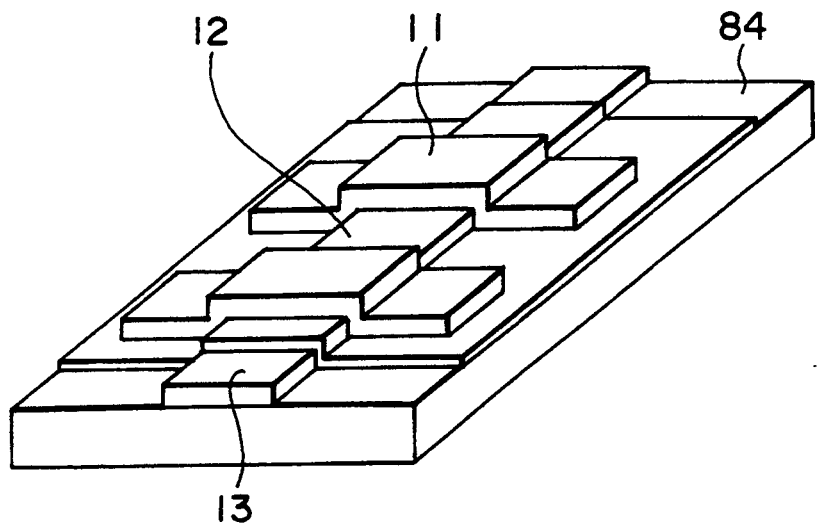
FIG. 5 is a perspective view of the MIM element used in the present invention.

The monomolecular film was formed by spreading over an aqueous phase of water temperature of 20° C. with a $CdCl_2$ concentration of $5 \times 10^{-4}$ mol/liter controlled to pH 6.7 with $KHCO_3$. After evaporation of the solvent, the surface pressure of such monomolecular layer was enhanced to 20 mN/m. Then while further maintaining this pressure constantly, the above substrate was dipped in the direction transversing the water surface gently at a speed of 10 mm/min., and subsequently drawn up gently at 5 mm/min, whereby two layers of Y-type monomolecular film were built-up. By repeating such procedure for an appropriate number of times, 8 kinds of built-up films 12 (FIG. 5) of 2, 4, 8, 12, 20, 30, 40, 60 layers were formed on the above substrate. Next, Al electrodes (film thickness of 1500Å) in shape of stripe with a width of 1 mm were vapor-deposited under vacuum so as to cross at right angle the base electrodes on such film surface while maintaining the substrate temperature at room temperature or lower to form upper electrodes 11 (FIG. 5).

Figure 6:
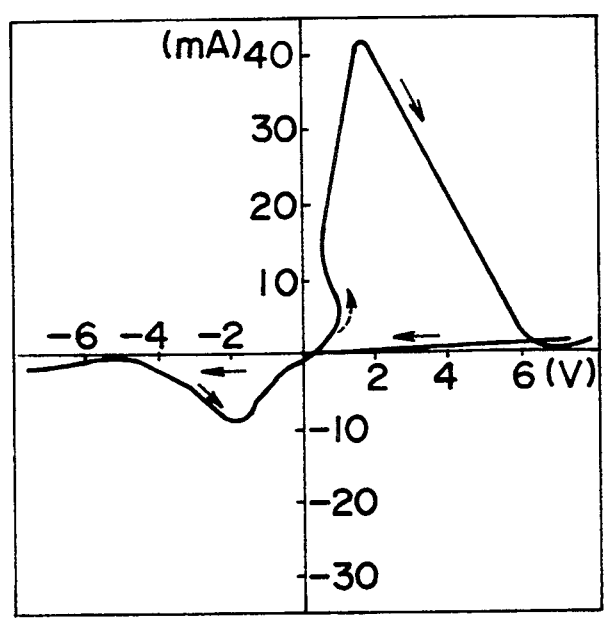
FIG. 6, FIG. 11, FIG. 12 and FIG. 14 are characteristic graphs showing electrical characteristics (V/I characteristics) of the MIM elements used in the present invention.
Figure 7:
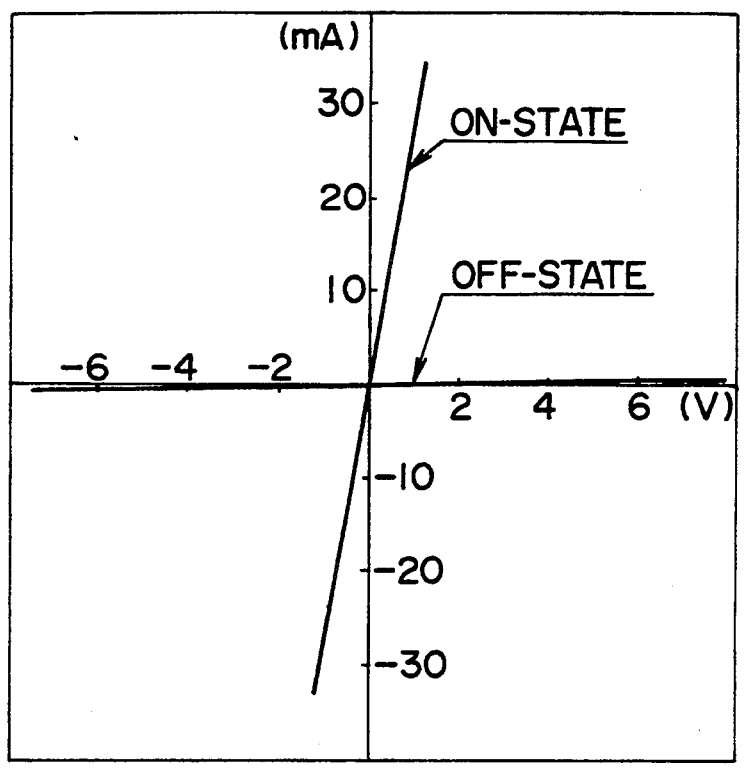
FIG. 7 and FIG. 13 are electrical characteristic graphs of ON-state and OFF-state confirmed in the MIM elements used in the present invention.

The current characteristic (V-I characteristic) when a voltage was applied between the upper and base electrodes of the sample having the MIM structure as prepared above (MIM element) was measured. In other samples, memorizable switching characteristic which has not been known in the art was observed (FIG. 6).

Further, stable ON-state (resistance value several tens $\Omega$) and OFF-state (resistance value M $\Omega$ or more) could be formed, and switching of ON→OFF exhibited a certain threshold voltage value (about 1 to 2 V/20 layers), and switching of OFF→ON occurred at about $-2$ to 5 V, and also the switching speed $1\mu$ sec. or lower, with ON/OFF ratio (ratio of resistance value of ON-state and OFF-state) being a number of 5 ciphers or more.

The threshold voltage value of switching tended to become higher as the layer number of the insulating layer is increased.

As the result, the switching characteristic in the 2 layer sample was unstable, while in the sample of 60 layers, switching of OFF→ON occurred with difficulty.

The thickness of one layer of SOZA dye as determined from the small angle X-ray diffraction method had a value of about 15$\Omega$.

Next, for the sample of 20 layers which exhibited relatively good switching characteristic, a switching circuit as shown in FIG. 1 was constituted.

The switching circuit shown in FIG. 1 has a direct current bias power source 14 and a resistor 15 connected to the switching device 1 having electroconductive films 11 and 13 and an insulating film 12 which form a MIM structure. Further, to the switching element is connected a resistance element (or capacitance element) 16. To the resistance element (or capacitance element) is connected a controlling terminal 17 for applying control signals on the switching element.

In this example, the direct current voltage (2 V) generated at the current bias power source 14 is supplied through the switching device 1 to the resistor 15, and the switching characteristic of such switching device is outputted at the voltage output terminal 18 as the potential (voltage drop) occurring at the both terminals of the resistor 15. Further in this example, there was used as the resistor 15 exhibiting a resistance of 100$\Omega$.

Next, control signals were applied from the controlling terminal 17 through the resistance element (or capacitance element) to the electroconductive film 13. In this example, as the resistance element (or capacitance element), a resistor of 200$\Omega$ was used, and the pulses obtained by amplification (by use of BIPOLAR OP AMP produced by KEPCO Co.) of the pulse (triangular wave) generated at the pulse generator (MODEL 164 produced by WAVETEK Co.) were inputted as control signals to the controlling terminal 17. The output voltage in this case was observed with the oscilloscope (2465 produced by TEKTRONIX Co.) connected to the voltage output terminal 18.

Figure 2:
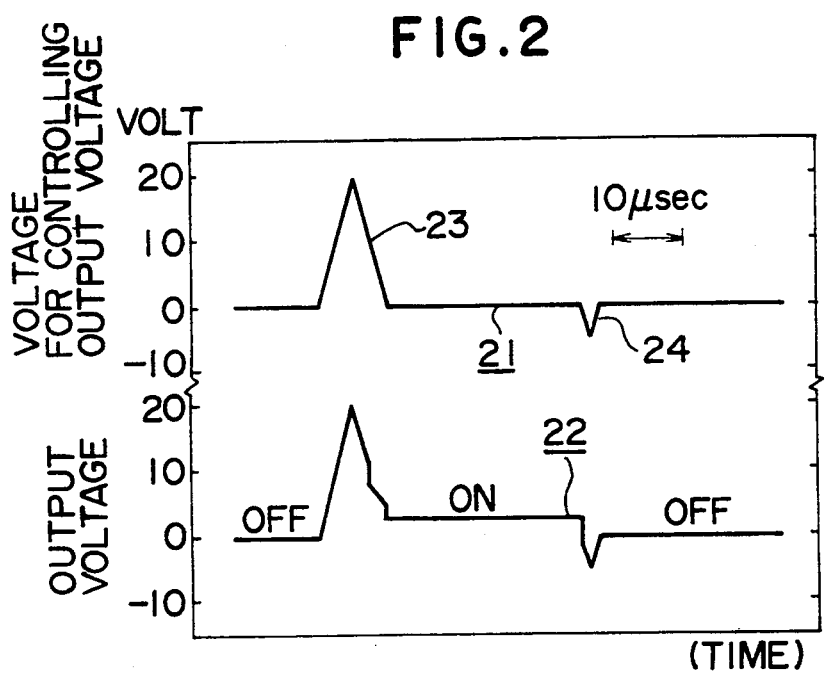
FIG. 2 is a characteristic graph showing the output voltage and the memory state when control signal is applied to the switching device of the present invention.

The results are shown in FIG. 2. In FIG. 21 is the control signal waveform inputted to the controlling terminal 17, 22 is the voltage wave-form outputted at the voltage output terminal 18. That as shown in FIG. 2, it has been found that when a positive triangular pulse wave 23 having a wave height value of about 10 to about 20 V is applied, the switching device 1 is switched from OFF-state to ON-state, while when a negative triangular pulse wave 24 having a wave height value of about 1 to 2 V is applied, the switching device 1 is switched from ON-state to OFF-state. Also, as shown in the Figure, when the voltage of the control signal is made to be 0 V, On-state and Off-state are memorized, respectively. The out put voltage at On-state under the memorized state in this case was about 1.4 V, and the output voltage at OFF-state 0 V.

From the above results, it has been made clear that a controlling terminal can be provided for the MIM element exhibiting the switching characteristic as shown in FIG. 6.

Example 2

Similarly as in Example 1, a MIM (switching) element was prepared to constitute the circuit shown in FIG. 1. However, the number of LB film layers was made only 20 layers. Also, while in Example 1 a resistor was used as the resistance element (or capacitance element) 16, condensers (4 kinds of $10^{-1}$, $10^{-2}$, $10^{-4}$, $10^{-5}$ $\mu$F) were used.

As the result, although the wave height value of the positive triangular pulse wave as used in Example 1 was changed to 6 to 8 V, it was confirmed that switching from OFF-state to ON-state sufficiently occurred at about 6 to 8 V. On the other hand, a wave height value of triangular pulse of about 1 V was necessary for switching from ON-state to OFF-state. Also, in this example, since the period after pulse application from the controlling terminal 17 and before switching is increased as the capacity value of the condenser is increased, the result was obtained that the capacity is desirably smaller at least in the range of $10^{-5}$ to $10^{-1}$ $\mu$F.

Also, it has been clarified from the above results that a device exhibiting controlled switching characteristic can be realized with a three-terminal device (2 in FIG. 1) which is a combination of a MIM element and a capacitance element.

Example 3

Figure 3:
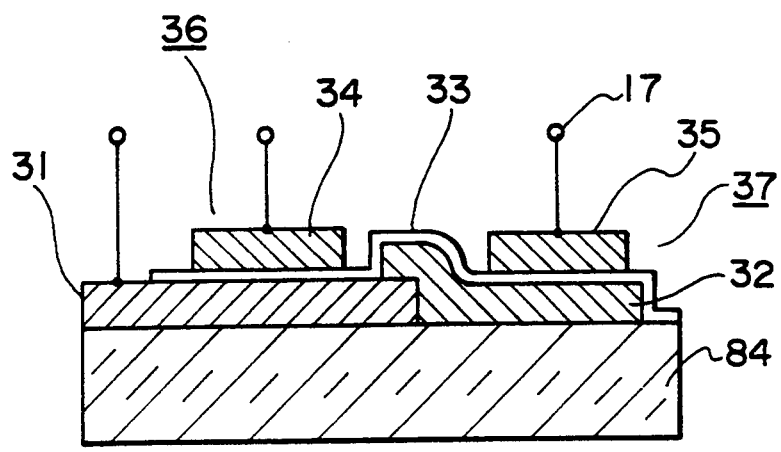
FIG. 3 and FIG. 4 are sectional views of the switching device used in the present invention.

A three-terminal device 2 having all the region enclosed with the broken line in FIG. 1 on the same substrate was prepared. However, in this case, a condenser was used as a resistance element (or capacitance element) and such condenser was formed of LB film sandwiched between Al electrodes. The constitution is schematically shown in FIG. 3. A specific preparation procedure is also shown below.

On a glass substrate 84 subjected to HMDS treatment similarly as in Example 1, Cr and Au were vapor-deposited to form a base electrode 31. Then, in the adjacent region, Al was deposited to a thickness of 1000Å also according to the vacuum vapor-deposition method to form Al electrode 32. Further, a part of the Al electrode was contacted with the Au base electrode 31. By use of such substrate 84, monomolecular films of SOAZ were built up (2, 4, 8, 12, 20, 30, 40, 60 layers) giving an insulating film 33 formed of the built-up film of monomolecular film. Next, Al as upper electrodes 34 and 35 were vacuum-vapor-deposited (thickness 1500Å) on the respective regions on the film surface having the base electrode 31 and the Al electrode 32 to form a three-terminal device comprising MIM element 36 and a condenser 37 connected thereto.

With such three-terminal device, a measurement circuit as shown in FIG. 1 was assembled similarly as in Example 1 and its characteristics were measured to give the same result as in Example 2. This indicates that a three-terminal device utilizing the switching characteristics of MIM element has been realized.

At this time, since the capacitance of the condenser was reduced (as considered) with increase in layer number of LB films, controllability of switching tended to be lowered. In view of the characteristics inherent in MIM element (switching characteristic is unstable in samples with small number of layers, for example, 2 to 4 layers), relatively good characteristics were obtained in samples with 8 to 20 layers in this Example. Also, since the MIM element and the LB film forming the condenser were made to be the same (constituent molecules, layer number, preparation conditions), simultaneous formation was rendered possible. As the result, the steps of forming the device became extremely simple.

Example 4

A sample having the condenser region and the MIM element formed continuously in the vertical direction to the film surface was prepared. The constitution is schematically shown in FIG. 4 and the preparation procedure shown below.

On a sufficiently washed glass substrate 84 (#7059, produced by Corning), an Al electrode 41 (thickness 1000Å) as a controlling terminal for switching was formed according to the vacuum-vapor-deposition method, and then LB films 42 of arachidic acid (C20) were laminated (3, 5, 9, 21, 41 and 81 deposition of Au 500Å (Au electrode 43) on the film surface a condenser was formed. The area of the condenser region was made to be 2 mm². The LB film 42 of C20 was obtained by spreading a chloroform solution dissolved at a concentration of 1 mg/ml over an aqueous phase with a $CdCl_2$ concentration of $4\times10^{-4}$ mol/liter and water temperature of 20° C. controlled to pH 6.3 with $KHCO_3$ to form a monomolecular film, followed by building-up thereof on the above substrate 84 according to the same conditions and the method as in Example 1. However, since the glass substrate and the surface of Al having naturally oxidized film thereon exhibit hydrophilic property, in carrying out built-up operations, it was necessary to dip previously the substrate into water and initiate the draw-up operation.

Figure 4:
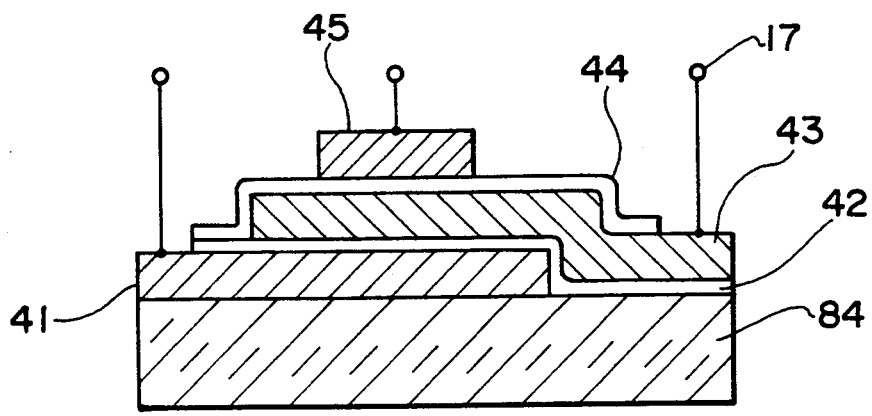

Further, after having 20 layers of SOAZ LB film built up on the substrate 84 having the Al (Al electrode 41)/C20 LB film 42/Au (Au electrode 43) laminated thereon, Al was again vapor-deposited (Al electrode 45) on such film surface to form a MIM element with Au (Au electrode 43)/SOAZ LB film 44/Al (Al electrode 45), thereby giving a sample with the constitution shown in FIG. 4. The built-up method for SOAZ LB film was the same as in Example 1.

For the sample as obtained above, measurement and evaluation were conducted similarly as in Example 2, whereby good switching characteristics were confirmed in samples of C20 (3 to 21 layers), in this Example, since MIM element and the condenser were laminated, the element shape (occupied area) could be made smaller to great extent. Also, since preparation of MIM element and LB film forming the condenser is performed in separate steps, optimum conditions for respective elements can be selected. As the result, a three-terminal switching device with excellent controllability and reliability could be realized.

In Examples 3 and 4, there was shown an example, in which the condenser formed of a LB film was made to be a part of the three-terminal devices, but the method for formation of and constituent material of such device do not limit the present invention at all. It is possible to form a condenser of an organic or inorganic dielectric material prepared by other preparation methods (e.g. coating method or vacuum vapor deposition method) and apply it to the above three-terminal device. Also, a hybrid type having a chip condenser, which has already been formed, mounted on a substrate is possible. On the other hand, without limitation to condensers, it is clear that the three-terminal device can be realized also by forming and connecting a resistor, as also shown in Example 1. Of course, its formation methods do not limit the present invention at all.

Example 5

On a substrate of ITO subjected to etching in stripe with a 1 mm width according to the known method as a support, monomolecular films of lutetium diphthalocyanine [LuH(Pc)$_2$] was built-up according to the LB method. A solution having dissolved LuH(Pc)$_2$ at a concentration of 0.5 mg/ml (solvent: 1/1/2 solvent mixture of chloroform/trimethylbenzene/acetone) was spread over pure water, in which the above substrate was previously dipped, of water temperature of 20° C. to form a monomolecular film. After evaporation of the solvent, the surface pressure of such monomolecular film was enhanced to 20 mN/m, and further while maintaining constantly the pressure, the above substrate previously dipped was drawn up in the direction transversing the water surface gently at a speed of 3 mm/min. to build up one layer of monomolecular film on the electrode substrate. Subsequently, dipping-withdrawal were repeated so as to transverse the water surface gently at the same ascending and descending speed of 3 mm/min, thereby forming 11, 21 and 31 layers of built-up film on the ITO. Next, on such film surface were formed Au electrode (film thickness 1000Å) and Al electrode (film thickness 1500Å) in stripe of a 1 mm width so as to cross at right angle the ITO electrode according to the vacuum-vapor-deposition method.

Figure 11:
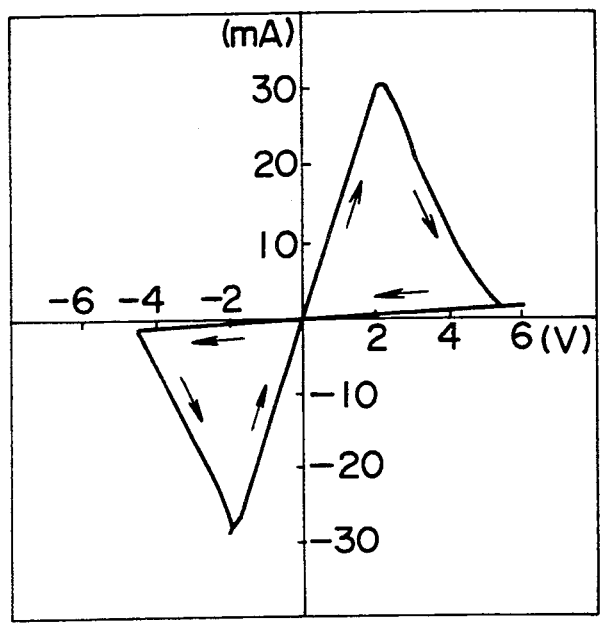

As the result of measurement of V-I characteristics of the samples as prepared above similarly as in Example 1, memorizable switching characteristics were observed for all of the samples prepared (FIG. 11).

On the other hand, in the switching characteristics, although the resistance value at ON-state is several tens $\Omega$ similarly as in Example 1, the resistance value at OFF-state is smaller by about one cipher as compared with the case of Example 1, but a ON/OFF ratio of about a number of 4 ciphers is obtained. Smaller resistance value at OFF-state may be considered to be due to the semiconductive properties possessed by LuH(Pc)$_2$. Switching speed was 0.1$\mu$ sec.

Also, since the switching characteristic is varied slightly depending on the organic dye used, such variance is not causes by contact with the electrodes but reflects the property of the insulating layer.

Further, the circuit shown in FIG. 1 was constituted and switching characteristic and its controllability were measured. As the result, memorizable switching characteristics were observed for all the samples prepared.

Also, switching at this time of OFF→ON and ON→OFF was confirmed to be controlled by application of pulses with wave height values of 6 V, 1 V, respectively.

The threshold voltage value exhibited substantially constant values irrespectively of difference in upper electrodes.

Examples 6–15

By use of electrode materials, insulating materials and layer numbers thereof shown in Table 1, samples having the same device structure as in Example 2 were prepared. Metal electrodes were formed by vacuum-deposition according to the resistance heating method.

Similarly as in Examples 1 and 5, V-I characteristics were measured to obtain the results shown in Table 1. In the Table, memorizable switching characteristic was observed for the samples as represented by the mark .

Also, when switching characteristic of the three-terminal device was conducted similarly as in Example 2, the results shown in Table 1 were obtained. As shown by the mark in the Table, controlled memorizable switching characteristic was observed for most of the samples.

In Example 7, in spite of use of SOAZ as the insulating material of MIM structure similarly as in Example 1, all of the 12 samples prepared under the same conditions exhibited only OFF-state, and no switching to ON-state could be confirmed. This may be considered to be due to formation of an insulating oxide film on the Sn electrode surface.

TABLE 1

| | | Preparation conditions and measurement results | | | | |
|---|---|---|---|---|---|---|
| Example | Base electrode | Upper electrode | Insulating material (layer number) | LB film forming conditions | Appearance of switching characteristic | Controlled switching characteristic |
| 6 | Pt (100 Å) | Au (1000 Å) | SOAZ (20) | the same as in Example 1 | o | o |
| 7 | Sn (1000 Å) | Al (1000 Å) | SOAZ (20) | the same as in Example 1 | x | x |
| 8 | Cr/Au (500 Å/1000 Å) | Al (1500 Å) | erbium diphthalocyanine (20) | the same as in Example 5 | o | o |
| 9 | ITO (1000 Å) | Al (1000 Å) | tetraphenyl porphyrin derivative* | the same as in Example 1 | o | o |

TABLE 1-continued

| | | | Preparation conditions and measurement results | | | |
|---|---|---|---|---|---|---|
| Example | Base electrode | Upper electrode | Insulating material (layer number) | LB film forming conditions | Appearance of switching characteristic | Controlled switching characteristic |
| 10 | ITO (1000 Å) | Al (1000 Å) | (20) anthracene derivative** | the same as in Example 1 | ○ | ○ |
| 11 | Cr/Au (500 Å/1000 Å) | Al (1500 Å) | (20) docosyl pyradinum-tetracyano quinodimethane | the same as in Example 5 | ○ | ○ |
| 12 | Cu/Au (500 Å/1000 Å) | Al (1500 Å) | (20) pentacosa-10,12-dinoic acid | the same as in Example 1 | ○ | ○ |
| 13 | Cr/Au (500 Å/1000 Å) | Al (1500 Å) | (20) ferrocene derivative (20)*** | the same as in Example 5 | ○ | ○ |
| 14 | Cr/Au (500 Å/1000 Å) | Al (1500 Å) | octadecyl-tetracyano-quinodimethane (20) | the same as in Example 5 | ○ | ○ |
| 15 | Cr/Au (500 Å/400 Å) | Al (1500 Å) | bacteriolodopsin **** | the same as in Example 5 | ○ | ○ |

*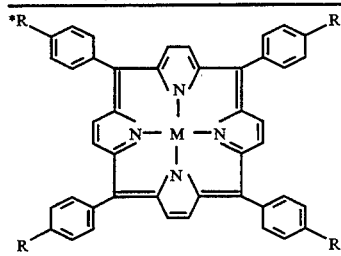

$R = OCH(COOH)C_{20}H_{41}$

** 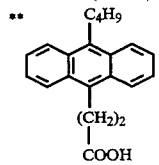

*** 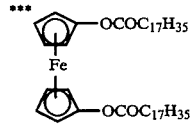

****Violet film obtained by culturing a highly halophilic bacterium, followed by extraction.

Example 16

On a glass substrate (#7059 produced by Corning Co.) subjected to hydrophobic treatment by being left to stand overnight in saturated vapor of hexamethyldisilane (HMDS) was formed Cr as the underlayer according to the vacuum-vapor-deposition method to a thickness of 500Å, followed further by vapor deposition of Au according to the same method (film thickness 1000Å) to form a base electrode in shape of a stripe with a width of 1 mm. On the substrate as a support, a monomolecular mixed film with a mixed molar ratio of arachidic acid (C20) and squarilium-bis-6-octylazulene (SOAZ) of 1:1 was built up. The details of the built-up method are described below.

After mixing a chloroform solution having C20 dissolved at $2 \times 10^{-3}M$ and a chloroform solution having SOAZ dissolved at $4 \times 10^{-4}M$ were mixed to a molar ratio of 1:1, the mixture was spread over an aqueous phase (pH 6.5) of water temperature of 20° C. containing $4 \times 10^{-4}M$ of Cd ions to form a mixed monomolecular film on the water surface. After evaporation of the solvent, the surface pressure of such mixed monomolecular film was enhanced to 20 mN/m, and further while maintaining the pressure constantly, the above substrate was dipped in the direction transversing the water surface gently at a speed of 10 mm/min., and then drawn up gently at a speed of 5 mm/min. to build up two layers of a Y-type mixed monomolecular film. By repeating such operations for an appropriate number of times, 9 kinds of mixed built-up films of 2, 4, 6, 8, 12, 20, 30, 40 and 60 layers were formed. Immediately after film formation, vacuum drying at 20° C., $1 \times 10^{-6}$ Torr was effected for 20 minutes. Next, on the film surface, Al electrode (film thickness 1500Å) shaped in a stripe of 1 mm width was vacuum-vapor-deposited so as to cross at right angle the base electrode, while maintaining the substrate temperature at room temperature or lower, to form an upper electrode.

Figure 12:
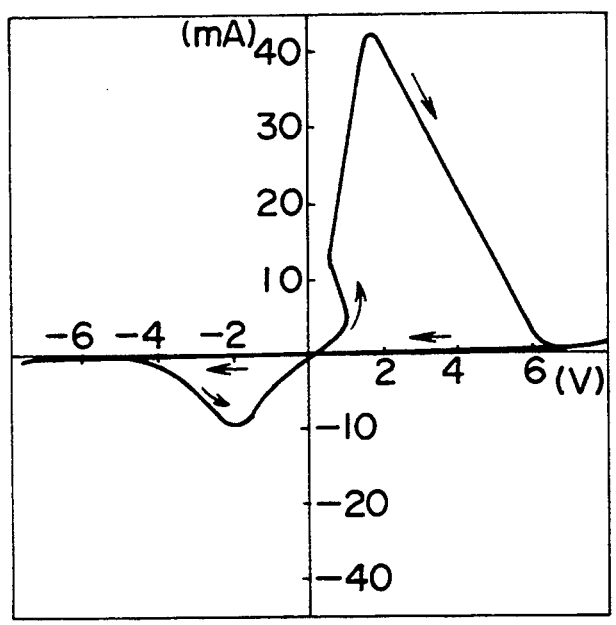
Figure 13:
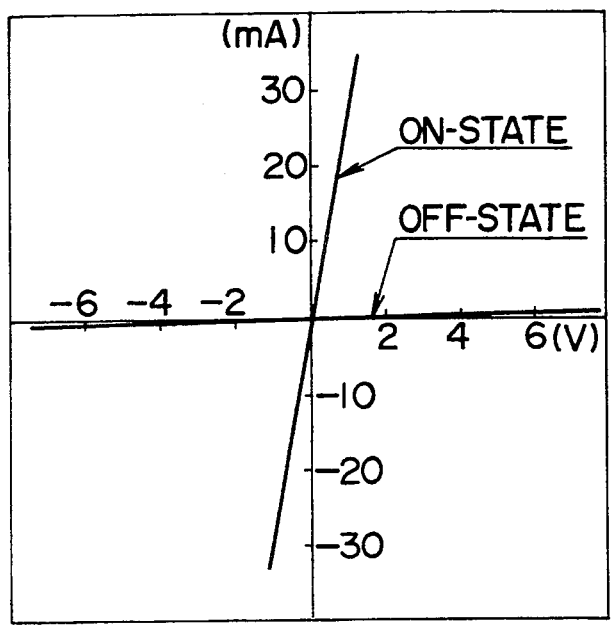

When the current characteristic (V-I characteristic) when a voltage was applied between the upper and base electrodes of the sample having the MIM structure as prepared above (MIM element) was measured, in other samples, memorizable switching characteristic which has not been known in the art was observed (FIG. 12). Further, stable ON-state (resistance value several tens $\Omega$) and OFF-state (resistance value M $\Omega$ or higher) can be made, and switching of ON→OFF exhibits a constant threshold voltage value (about 1-2 V/20 layers), switching of OFF→ON occurs at −2 to 5 V, and also the switching speed was $1\mu$ sec. or less, with the ON/-

OFF ratio (ratio of resistance value in ON-state and Off-state) being a number of 5 ciphers or more.

The threshold voltage value of switching tended to be increased as the layer number of the insulating layers was increased. As the result, switching characteristic was unstable in the two layer sample, while switching of OFF→ON occurred with difficulty in the sample of 60 layers.

Example 17

On a substrate of ITO subjected to etching in stripe with 1 mm width according to conventional method as a support, a mixed monomolecular film of diacetylene (DA) and lutetium diphthalocyanine (LuH(Pc)$_2$) was built up according to the LB method. The solution used had a mixed molar ratio of 2:1, with the DA concentration being $1 \times 10^{-1}$M (solvent is benzene), LuH(Pc)$_2$ concentration being $3 \times 10^{-4}$M (solvent is 1/1/2 solvent mixture of chloroform/trimethylbenzene/acetone). The solution was spread over an aqueous phase (pH 6.8), in which the substrate was previously dipped, of water temperature of 20° C. containing $4 \times 10^{-4}$M of MnCl$_2$ to form a mixed monomolecular film on the water surface. After evaporation of the solvent, the surface pressure of the monomolecular film was enhanced to 20 mN/m and, while further maintaining the pressure constantly, the above substrate previously dipped was drawn up in the direction transversing the water surface gently at a speed of 3 mm/min. to build up one layer of the mixed monomolecular film on the electrode surface. Subsequently, by repeating dipping and withdrawal so as to transverse the water surface gently at the same ascending and descending speed of 3 mm/min., built-up films of 11, 21 and 31 layers were formed on ITO. Next, on the film surface, so as to cross at right angle the ITO electrode, Ag electrode (film thickness 1000Å) was formed in stripe of 1 mm width similarly as in Example 1.

Figure 14:
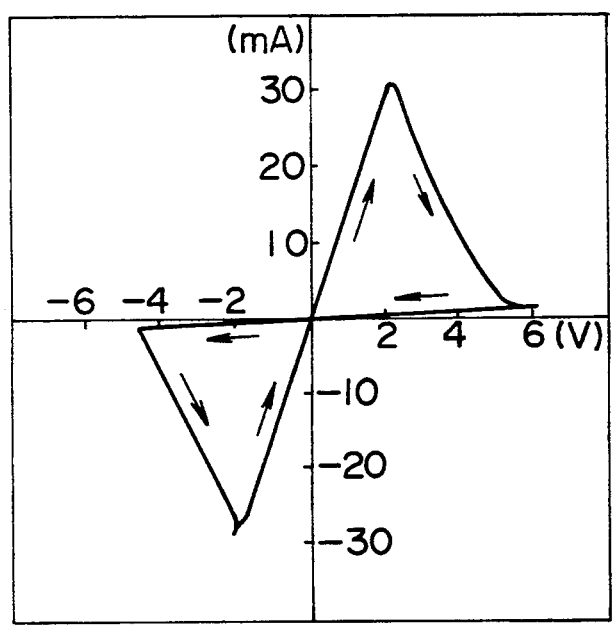

For the samples as prepared above, V-I characteristics were measured similarly as in Example. 16 to obtain the result that memorizable switching characteristic was observed for all of the samples prepared (FIG. 14). The threshold voltage value exhibited substantially constant value irrespective of difference in upper voltage. The resistance value at ON-state was several tens Ω which was similar to in Example 16, but the resistance value at OFF-state was smaller by one cipher as compared with the case of Example 16, but a ON/OFF ratio of about a number of 4 cipher is obtained. Smaller resistance value at OFF state may be considered to be due to the semiconductive properties possessed by LuH(Pc)$_2$. Switching speed was 0.1μ sec similarly as in Example 16.

Example 18

A MIM element was prepared similarly as in Example 16. However, in this case, the mixed monomolecular built-up film comprises 12 layers of mixed monomolecular films mixed at a ratio of 2:1 of a polyamideamine salt (PAAD) and bis-[3-stearylbenzothiazole-(2)]-trimethinecyanine iodide. The concentration was $1 \times 10^{-3}$M (solvent was a solvent mixture of benzene/dimethylacetamide=1:1), and the concentration of the cyanine salt was also $1 \times 10^{-3}$M and the solvent was chloroform. Also for measurement of V-I characteristic, Example 16 was repeated to obtain memorizable switching characteristic.

Examples 19–29

By use of the electrode materials, insulating materials, layer numbers thereof and molar ratios shown in Table 2, samples having the same device structure as in Examples 16–18 were prepared. The metal electrodes were formed by vacuum-vapor-deposition according to the resistance heating method.

Next, V-I characteristics were measured similarly as in Examples 16 to 18 to give the results shown in Table 2. For the samples indicated by the mark, memorizable switching characteristics were observed. Also, repeated stability was evaluated by the number of times until electrode breaking occurs by heat generation when a triangular wave with a wave height value of ±8 V and an alternate electrical field frequency of 2 Hz was continued to be applied continuously, to give the results shown in the Table.

Concerning the mixing ratio of the materials constituting organic insulation, it may be in the range from 1:10 to 100:1, particularly suitably from 1:10 to 10:1. Such molar ratio is not limited at all.

The organic materials to be mixed are not limited to two kinds, and any desired number of kinds may be used.

TABLE 2

| | | | Preparation conditions and measurement results | | | | |
|---|---|---|---|---|---|---|---|
| Example | Base electrode | Upper electrode | Insulating material (layer number) | Molar ratio | LB film forming conditions | Appearance of switching characteristic | Repeating stability (times) |
| 19 | Cr/Au (500Å/1000Å) | Al (1500Å) | C$_{20}$ = SOAZ (20) | 1:10 | the same as in Example 1 | o | $3 \times 10^6$ |
| 20 | Cr/Au (500Å/1000Å) | Al (1500Å) | " | 1:5 | the same as in Example 1 | o | $5 \times 10^6$ |
| 21 | Cr/Au (500Å/1000Å) | Al (1500Å) | " | 1:2 | the same as in Example 1 | o | $8 \times 10^6$ |
| 22 | Cr/Au (500Å/1000Å) | Al (1500Å) | " | 1:1 | the same as in Example 1 | o | $1 \times 10^7$ |
| 23 | Cr/Au (500Å/1000Å) | Al (1500Å) | " | 2:1 | the same as in Example 1 | o | $7 \times 10^6$ |
| 24 | Cr/Au (500Å/1000Å) | Al (1500Å | " | 5:1 | the same as in Example 1 | o | $5 \times 10^6$ |
| 25 | Cr/Au (500Å/1000Å) | Al (1500Å) | " | 10:1 | the same as in Example 1 | o | $3 \times 10^6$ |
| 26 | ITO (1000Å) | Ag (1000Å) | DA + PC (18) | 1:2 | the same as in Example 2 | o | $1 \times 10^7$ |
| 27 | ITO (1000Å) | Ag (1000Å) | DA + PC (18) | 1:1 | the same as in Example 2 | o | $7 \times 10^6$ |
| 28 | Cr/Au (500Å/1000Å) | Al (1000Å) | PAAD + cyanine salt (20) | 1:5 | the same as in Example 3 | o | $9 \times 10^6$ |

TABLE 2-continued

| | | | Preparation conditions and measurement results | | | | |
|---|---|---|---|---|---|---|---|
| Example | Base electrode | Upper electrode | Insulating material (layer number) | Molar ratio | LB film forming conditions | Appearance of switching characteristic | Repeating stability (times) |
| 29 | Cr/Au (500Å/1000Å) | Al (1000Å) | PAAD + cyanine salt (20) | 2:1 | the same as in Example 3 | o | $7 \times 10^6$ |

In the Examples as described above, the LB method was used for formation of the dye insulating layer, but a film forming method capable of preparing a very thin and uniform insulating organic thin film may be available without limitation to the LB method. Specifically, the vacuum-vapor-deposition method, the electrolytic polymerization method, the CVD method, etc. may be used, whereby the scope of available organic materials can be broadened.

As already mentioned also for formation of electrodes, a film forming method capable of forming a uniform thin film on an organic thin film layer is available, and such method is not limited to the vacuum-vapor-deposition method and the sputtering method.

Further, the present invention is not limited at all in the substrate material and its shape.

The present invention has the following effects.

(1) In a MIM structure device by use of a thin film of an organic dye monomolecular film built up by the LB method, memorizable switching characteristic not found in the MIM element of the prior art was exhibited to be obtained.

(2) It has been made clear that a three-terminal device having controllability for the above switching characteristic can be obtained by combining the MIM element with an element constituent exhibiting resistance or capacitance.

(3) Owing to the method which forms an insulating layer by building up monomolecular films, film thickness control at the molecular order (several Å to several tens Å) could be realized with ease. Also, due to excellent controllability, reproducibility during formation of the device is high to give high productivity.

(4) Since a mixed monomolecular film is used, LB film formation has become possible even for a material which could not be formed into a film in the prior art, and as the result of increased degree of freedom in choice of the materials, various switching characteristics could be found.

(5) As compared with the switching device constituted only of inorganic materials, degree of freedom is higher, and also device formation at lower temperature is possible, and therefore a device having high affinity for biological bodies such as molecular electronics, bioelectronics, etc. can be provided in future.

What is claimed is:

1. A switching device comprising an electrode-insulator-electrode structure supported on a substrate having a supporting function, said insulator having a periodical layer structure from 10Å to 1000Å in thickness of an organic insulator comprising a molecule having Pi electron conjugated system, one of said electrodes, which is close to said substrate as compared to the other electrode, being selected from a noble metal or an oxide conductor, said device having a first memorable electrical state exhibiting a first resistance and a second memorizable electrical state exhibiting a higher second resistance in a voltage region below a first threshold voltage and above a different second threshold voltage, said device being switchable from the first electrical state to the second electrical state upon application of a voltage of one polarity equal to or exceeding said first threshold voltage and switchable from the second electrical state to the first electrical state upon application of an opposite polarity voltage equal to or exceeding the second threshold voltage.

2. A switching device according to claim 1, wherein said organic insulator has a group having $\pi$ electron level and a group having $\nu$ electron level.

3. A switching device according to claim 1, wherein said periodical layer structure is formed of LB films.

4. A switching device according to claim 2, wherein said organic insulator having a group having $\pi$ electron level and a group having $\nu$ electron level is selected from dyes having porphyrin skelton, azulene dyes, cyanine dyes, compounds having fused polycyclic aromatic rings or heterocyclic rings and diacetylene compounds.

5. A switching device according to claim 1, wherein said organic insulator comprises a compound having a skelton represented by the formula:

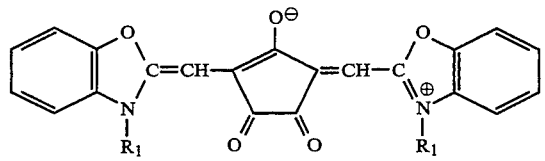

wherein $R_1$ represents an alkyl group.

6. A switching device according to claim 1, wherein said organic insulator comprises a compound having a skelton represented by the formula:

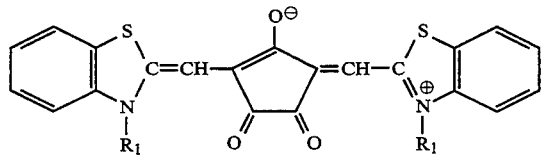

wherein $R_1$ represents an alkyl group.

7. A switching device according to claim 1, wherein said organic insulator comprises a compound having a skelton represented by the formula:

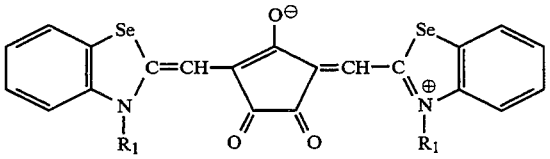

wherein $R_1$ represents an alkyl group.

8. A switching device according to claim 1, wherein said organic insulator comprises a compound having a skelton represented by the formula:

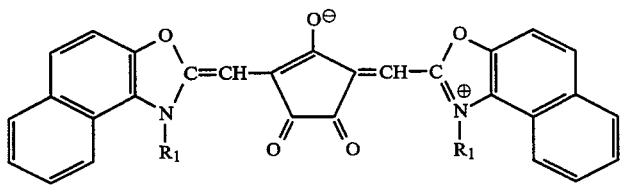

wherein $R_1$ represents an alkyl group.

9. A switching device according to claim 1, wherein said organic insulator comprises a compound having a skelton represented by the formula:

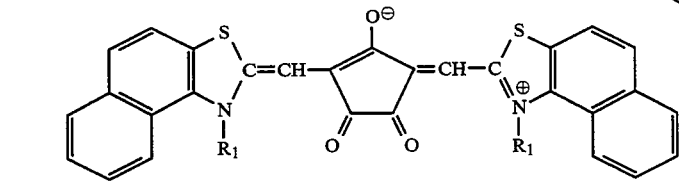

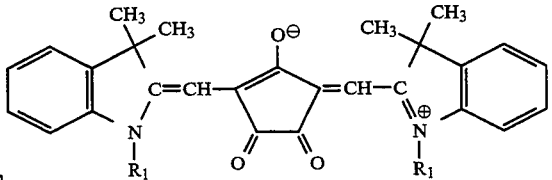

wherein $R_1$ represents an alkyl group.

10. A switching device according to claim 1, wherein said organic insulator comprises a compound having a skelton represented by the formula:

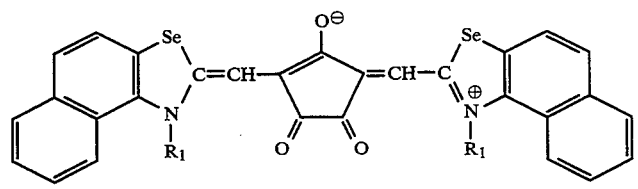

wherein $R_1$ represents an alkyl group.

11. A switching device according to claim 1, wherein said organic insulator comprises a compound having a skelton represented by the formula:

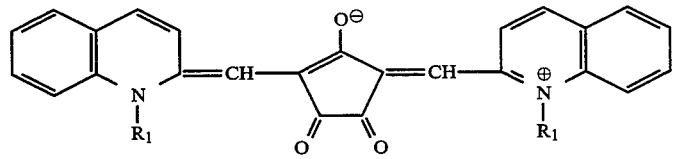

wherein $R_1$ represents an alkyl group.

12. A switching device according to claim 1, wherein said organic insulator comprises a compound having a skelton represented by the formula:

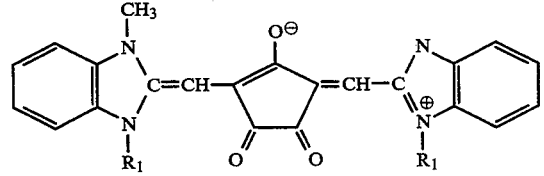

wherein $R_1$ represents an alkyl group.

13. A switching device according to claim 1, wherein said organic insulator comprises a compound having a skelton represented by the formula:

wherein $R_1$ represents an alkyl group.

14. A switching device according to claim 1, wherein said organic insulator comprises a compound having a skelton represented by the formula:

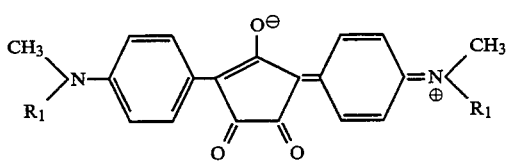

wherein $R_1$ represents an alkyl group.

15. A switching device according to claim 1, wherein said organic insulator comprises a compound having a skelton represented by the formula:

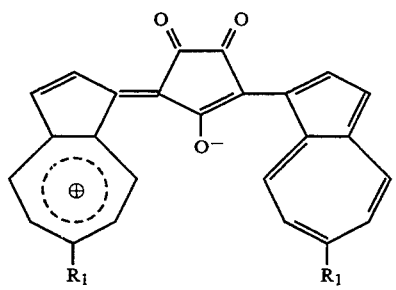

wherein R₁ represents an alkyl group.

16. A switching device according to claim 1, wherein said organic insulator comprises a compound having a skelton represented by the formula:

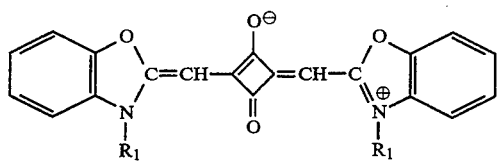

wherein R₁ represents an alkyl group.

17. A switching device according to claim 1, wherein said organic insulator comprises a compound having a skelton represented by the formula:

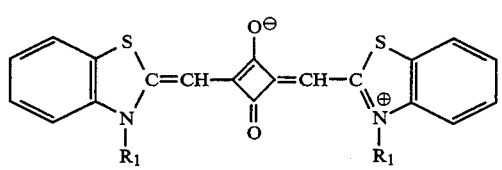

wherein R₁ represents an alkyl group.

18. A switching device according to claim 1, wherein said organic insulator comprises a compound having a skelton represented by the formula:

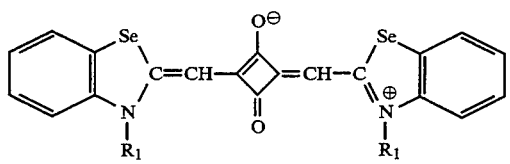

wherein R₁ represents an alkyl group.

19. A switching device according to claim 1, wherein said organic insulator comprises a compound having a skelton represented by the formula:

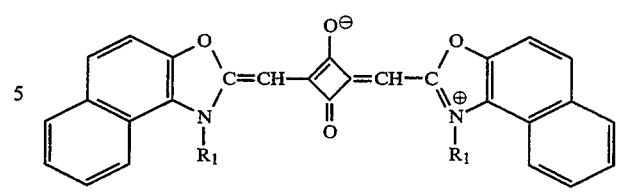

wherein R₁ represents an alkyl group.

20. A switching device according to claim 1, wherein said organic insulator comprises a compound having a skelton represented by the formula:

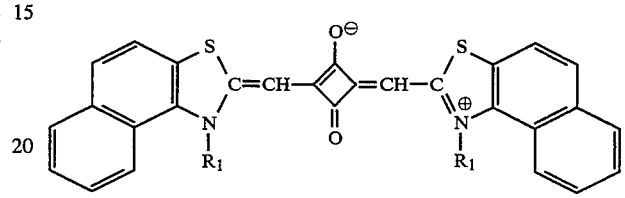

wherein R₁ represents an alkyl group.

21. A switching device according to claim 1, wherein said organic insulator comprises a compound having a skelton represented by the formula:

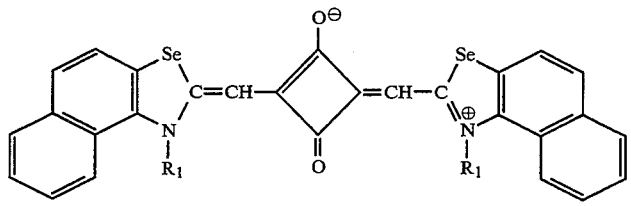

wherein R₁ represents an alkyl group.

22. A switching device according to claim 1, wherein said organic insulator comprises a compound having a skelton represented by the formula:

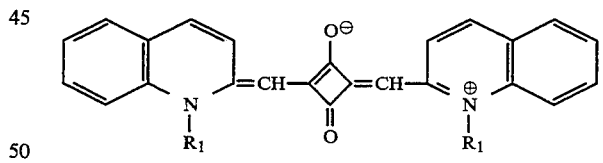

wherein R₁ represents an alkyl group.

23. A switching device according to claim 1, wherein said organic insulator comprises a compound having a skelton represented by the formula:

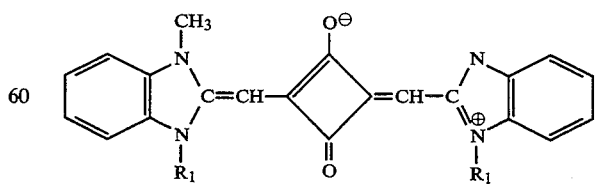

wherein R₁ represents an alkyl group.

24. A switching device according to claim 1, wherein said organic insulator comprises a compound having a skelton represented by the formula:

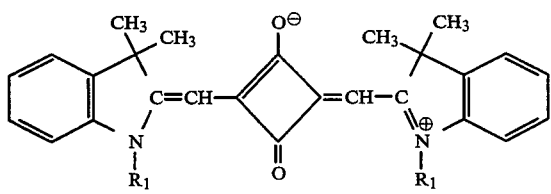

wherein $R_1$ represents an alkyl group.

25. A switching device according to claim 1, wherein said organic insulator comprises a compound having a skelton represented by the formula:

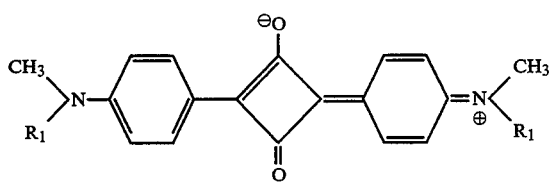

wherein $R_1$ represents an alkyl group.

26. A switching device according to claim 1, wherein said organic insulator comprises a compound having a skelton represented by the formula:

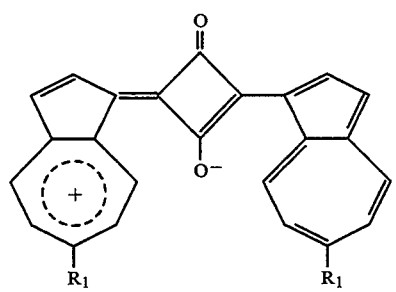

wherein $R_1$ represents an alkyl group.

27. A switching device according to claim 1, wherein said organic insulator comprises a compound having a skelton represented by the formula:

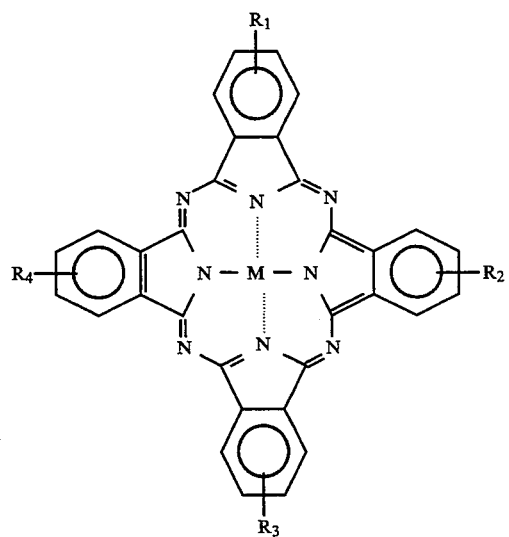

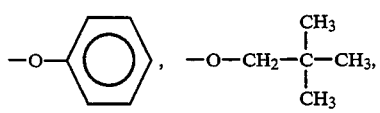

28. A switching device according to claim 1, wherein said organic insulator comprises a compound having a skelton represented by the formula:

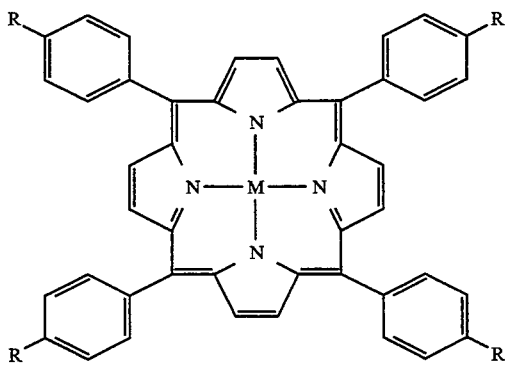

wherein R is —OCH (COOH) $CnH_{2n+1}$ ($5 \leq H \leq 25$) and M is H Cu, Ni, Zn, Al-Cl or a rare earth metal ion.

29. A switching device according to claim 1, wherein said organic insulator comprises a compound having a skelton represented by the formula:

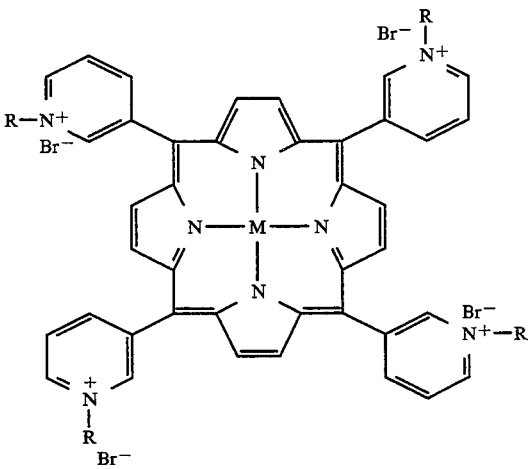

wherein R is $CnH_{2n+1}$ ($5 \leq n \leq 25$) and M is $H_2$, Cu, Ni, Zn, Al-Cl or a rare earth metal ion.

30. A switching device according to claim 1, wherein said organic insulator comprises a compound having a skelton represented by the formula

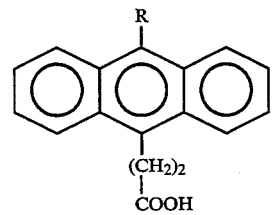

wherein R is $C_4$–$C_{12}$ alkyl.

31. A switching device according to claim 1, wherein said organic insulator comprises a compound having a skelton represented by the formula:

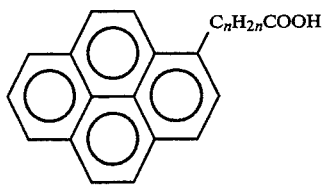

32. A switching device according to claim 1, wherein said organic insulator comprises a compound having a skelton represented by the formula:

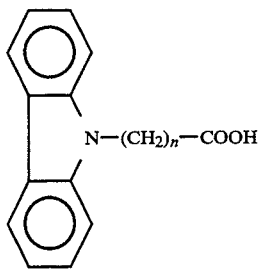

33. A switching device according to claim 1, wherein said organic insulator comprises a compound having a skelton represented by the formula:

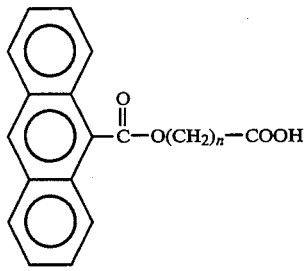

34. A switching device according to claim 1, wherein said organic insulator comprises a compound having a skelton represented by the formula:

wherein X is —COOH, —OH or —CONH and n is 0 or more and m is 20 or less, provided that the formula (n+m>10) is satisfied.

35. A switching device according to claim 1, wherein said organic insulator comprises a compound having a skelton represented by the formula:

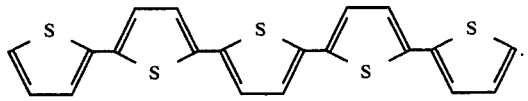

36. A switching device according to claim 1, wherein said organic insulator comprises a compound having a skelton represented by the formula:

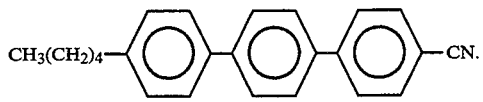

37. A switching device according to claim 1, wherein said organic insulator comprises a compound having a skelton represented by the formula:

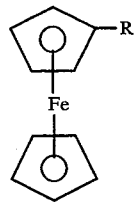

wherein R is $CONHC_{18}H_{37}$ or $OCOC_{17}H_{35}$.

38. A switching device according to claim 1, wherein said organic insulator comprises a compound having a skelton represented by the formula:

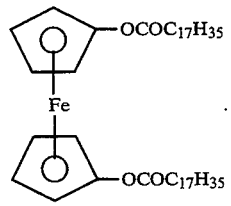

wherein R is $CONHC_{18}H_{37}$ or $OCOC_{17}H_{35}$.

39. A switching device according to claim 1, wherein said organic insulator comprises a compound having a skelton represented by the formula:

wherein R is $CONHC_{18}H_{37}$ ir $OCOC_{17}H_{35}$.

40. A switching device according to claim 1, wherein said organic insulator comprises a compound having a skelton represented by the formula:

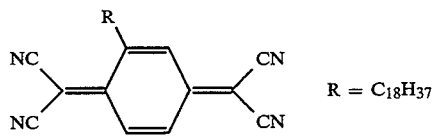

wherein R is $C_{18}H_{37}$.

41. A switching device comprising an electrode-insulator-electrode structure supported on a substrate having a supporting function, said insulator having a periodical layer structure from 10Å to 1000Å in thickness of an organic insulator, one of said electrodes, which is close to said substrate as compared to the other electrode, being selected from a noble metal or an oxide conductor, said layer being a mixed monomolecular film or a mixed monomolecular built-up film of an amphiphilic compound having a hydrocarbon chain or a polymeric compound having a hydrophobic region and a hydrophilic region and a molecule having Pi electron conjugated system said device having a first memorizable electrical state exhibiting a first resistance and a second memorizable electrical state exhibiting a higher second resistance in a voltage region below a first threshold voltage and above a different second threshold voltage, said device being switchable from the first electrical state to the second electrical state upon application of a voltage of one polarity equal to or exceeding said first threshold voltage and switchable from the second electrical state to the first electrical state upon application of an opposite polarity voltage equal to or exceeding the second threshold voltage.

42. A switching device according to claim 41, wherein in the amphiphilic compound having a hydrocarbon chain, a part of or all of the hydrocarbon skelton have a unsaturated bond.

43. A switching device according to claim 41, wherein said molecule having $\pi$ electron conjugated system is a dye having porphyrin skelton, an azulene dye, a cyanine dye, a merocyanine dye or a molecule having at least one aromatic ring or heterocyclic ring.

44. A switching device according to claim 41, wherein for said mixed molecular film or mixed monomolecular built-up film, the mixed molar ratio of the amphiphilic compound having hydrocarbon chain and the molecule having $\pi$ electron conjugated system is from 1:100 to 100:1.

45. A switching device comprising an electrode-insulator-electrode structure supported on a substrate having a supporting function, said insulator having a periodical layer structure from 10Å to 1000Å in thickness of an insulating or semiconductive organic metal comprising a molecule having Pi electron conjugated system, one of electrodes, which is close to said substrate as compared to the other electrode, being selected from a noble metal or an oxide conductor, and means for applying electrical signals for controlling the switching characteristics of said switching device, said device having a first memorizable electrical state exhibiting a first resistance and a second memorizable electrical state exhibiting a higher second resistance in a voltage region below a first threshold voltage and above a different second threshold voltage, said device being switchable from the first electrical state to the second electrical state upon application of a voltage of one polarity equal to or exceeding said first threshold voltage and switchable from the second electrical state to the first electrical state upon application of an opposite polarity voltage equal to or exceeding the second threshold voltage.

46. A switching device according to claim 45, wherein said organic material a group having $\pi$ electron level and a group having $\nu$ electron level in the molecule.

47. A switching device according to claim 45, wherein the layer having said organic material is a layer comprising a mixture of an amphiphilic compound having a hydrocarbon chain or a polymeric compound having a hydrophobic region and a hydrophilic region in combination and a molecule having $\pi$ electron conjugated system.

48. A switching device according to claim 45, wherein said switching device has a MIM structure, and also said means for applying electrical signals is connected to a resistance element or a capacitance element.

49. A switching device according to claim 48, wherein said switching device with MIM structure and the resistance element or the capacitance element are formed on the same substrate.

50. A switching device according to claim 49, wherein said organic material layer with MIM structure and said resistance element or capacitance element are formed at the same time.

51. A switching device according to claim 49, wherein said organic layer and said resistance element or capacitance layer are formed in separate layers.

52. A switching device according to claim 45, wherein said periodical layer structure is a layer structure formed of an LB film.

53. A switching device according to claim 52, wherein said LB film is formed of built-up films.

54. A switching device according to claim 53, wherein the built-up number of the built-up films is 2 to 60.

55. A switching device according to claim 48, wherein said resistance element or capacitance element has an organic material layer formed of a LB film.

56. A switching device according to claim 55, wherein said LB film is formed of built-up films.

57. A switching device according to claim 56, wherein the built-up number of the built-up films is 2 to 60.

58. A switching device according to claim 1 wherein the noble metal is Au, Ag, Pd or Pt.

59. A switching device according to claim 41 wherein the noble metal is Au, Ag, Pd or Pt.

60. A switching device according to claim 45 wherein the noble metal is Au, Ag, Pd or Pt.

61. A switching device comprising an electrode-organic insulator-electrode structure supported on a substrate having a supporting function, said organic insulator from 10Å to 1000Å in thickness being formed of a LB film or an organic material having a Pi electron level, one of said electrodes, which is close to said substrate as compared to the other electrode, being selected from a noble metal or an oxide conductor, said device having a first memorizable electrical state exhibiting a first resistance and a second memorizable electrical state exhibiting a higher second resistance in a voltage region below a first threshold voltage and above a different second threshold voltage, said device being switchable from the first electrical state to the second electrical state upon application of a voltage of one polarity equal to or exceeding said first threshold voltage and switchable from the second electrical state to the first electrical state upon application of an opposite polarity voltage equal to or exceeding the second threshold voltage.

62. A switching device according to claim 61, wherein the noble metal is Au, Ag, Pd or Pt.

63. A switching method, comprising the steps of:
(a) providing a device comprising an electrode-organic insulator-electrode structure supported on a substrate having a supporting function, said organic insulator having a periodical structure from 10Å to 1000Å in thickness, said organic insulator comprising a molecule having a Pi electron conjugated system and one of said electrodes, which is close to said substrate as compared to the other electrode, being selected from a noble metal or an oxide conductor, wherein said device having a first memorizable electrical state exhibiting a first resistance and a second memorizable electrical state exhibiting a higher second resistance in a voltage region below a first threshold voltage and above a different second threshold voltage, said device being switchable between said electrical states; and
(b) applying a voltage of one polarity equal to or exceeding a threshold voltage between said electrodes to switch the device to a different electrical state and, optionally, applying a voltage of an opposite polarity equal to or exceeding the other threshold voltage to switch said device to the other electrical state.

64. The switching method according to claim 63, wherein said electroconductive material is selected from the group consisting of a noble metal and an oxide conductor.

65. The switching method according to claim 64, wherein the noble is Au, Pt, Ag or Pd.

66. The switching method according to claim 64, wherein the oxide conductive material is an indium-tin-oxide.

67. The switching method according to claim 63, wherein said molecule having Pi electron conjugated system is selected from dyes having porphyrin skeleton, azulene dyes, cyanine dyes, compounds having fused polycyclic aromatic rings or heterocyclic rings and diacetylene compounds.

68. The switching method according to claim 63, wherein said periodical layer structure is formed of LB films.

69. The switching method according to claim 68, wherein said LB film is formed of built-up films.

70. The switching method according to claim 69, wherein the built-up number of the films is 2 to 60.

71. A memory device comprising an electrode-insulator-electrode structure supported on a substrate having a supporting function, said insulator having a periodical layer structure from 10Å to 1,000Å in thickness of an organic insulator comprising a molecule having Pi electron conjugated system, one of said electrodes, which is close to said substrate as compared to the other electrode, being selected from a noble metal or an oxide conductor, said device having a first memorizable electrical state exhibiting a first resistance and a second memorizable electrical state exhibiting a higher second resistance in a voltage region below a first threshold voltage and above a different second threshold voltage, said device being switchable from the first electrical state to the second electrical state upon application of a voltage of one polarity equal to or exceeding said first threshold voltage and switchable from the second electrical state to the first electrical state upon application of an opposite polarity voltage equal to or exceeding the second threshold voltage.

72. A switching device according to claim 1 wherein the second electrical state is switchable from the first electrical state by application of the second threshold voltage followed by application of voltage of the same polarity as said one polarity.

* * * * *

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 1

Line 11, "MIM" should read --metal-insulator-metal (MIM)--.
Line 12, "metal-insulation" should be deleted.
Line 13, "metal" should be deleted.
Line 32, "element" should read --elements--.
Line 35, "element" should read --elements--.
Line 61, "potential; further" should read --potential. Further--.

COLUMN 2

Line 21, "fop" should read --for--. (both occurrences)
Line 64, "a fused" should read --fused--.

COLUMN 3

Line 22, "(amphiphilic" should read --amphiphilic--.

COLUMN 5

Line 55, "$\nu$ electron" should read --$\sigma$ electron--.
Line 56, "and also it is" should read --such as--.
Line 63, "course. [II]" should read --course. ¶ [II]--.

COLUMN 8

Line 32, "$\nu$ electron" should read --$\sigma$ electron-- and "above. [IV]" should read --above. ¶ [IV]--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 9

Line 21, "used. [CII]" should read --used. ¶ [VI]--.

Formula 5), " 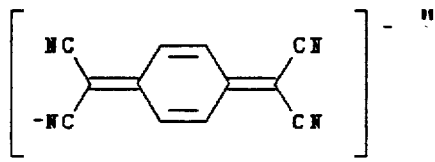 - "

should read -- 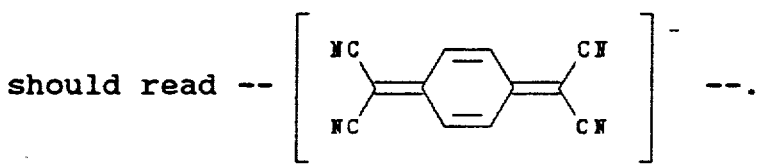 --.

COLUMN 10

Line 24, "gas" should read --"gas--.
Line 35, "shown" should read --shown by,--.
Line 52, "maintain" should read --maintaining--.
Line 53, "pressure" should read --pressure,--.

COLUMN 12

Line 32, "skelton" should read --skeleton--.

COLUMN 13

Line 6, "H electron" should read --π electron--.
Line 8, "have" should read --has--.
Line 34, "Graphite" should read --graphite--.
Line 43, "Gener-" should read --gener- --.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 14

Line 43, "15Ω." should read --15Å.--.

COLUMN 15

Line 9, "FIG. 21" should read --Fig. 2, 21--.
Line 12, "That" should read --That is,--.
Line 22, "out put" should read --output--.

COLUMN 16

Line 46, "81 deposition" should read --81 layers) on such substrate 84. Then by vapor-deposition--.

COLUMN 18

Line 12, "a" should read --an--.
Line 19, "causes" should read --caused--.
Line 42, "mark ." should read --mark O.--.
Line 46, "mark  in" should read --mark O in--.

COLUMN 21

Line 40, "Example, 16" should read --Example 16,--.

COLUMN 22

Line 2, "a" should read --an--.
Line 32, "mark ," should read --mark O,--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 23

Line 64, "memorable" should read --memorizable--.

COLUMN 24

Line 19, "$\nu$ electron" should read --$\sigma$ electron--.
Line 22, "claim 2;" should read --claim 2,--.
Line 24, "$\nu$ electron" should read --$\sigma$ electron--.
Line 25, "skelton," should read --skeleton,--.
Line 30, "skelton" should read --skeleton--.
Line 43, "skelton" should read --skeleton--.
Line 55, "skelton" should read --skeleton--.
Line 68, "skelton" should read --skeleton--.

COLUMN 25

Line 13, "skelton" should read --skeleton--.
Line 27, "skelton" should read --skeleton--.
Line 41, "skelton" should read --skeleton--.
Line 55, "skelton" should read --skeleton--.
Line 68, "skelton" should read --skeleton--.

COLUMN 26

Line 56, "skelton" should read --skeleton--.
Line 68, "skelton" should read --skeleton--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 27

Line 16, "skelton" should read --skeleton--.
Line 43, "skelton" should read --skeleton--.
Line 55, "skelton" should read --skeleton--.
Line 68, "skelton" should read --skeleton--.

COLUMN 28

Line 13, "skelton" should read --skeleton--.
Line 26, "skelton" should read --skeleton--.
Line 42, "skelton" should read --skeleton--.
Line 54, "skelton" should read --skeleton--.
Line 68, "skelton" should read --skeleton--.

COLUMN 29

Line 14, "skelton" should read --skeleton--.
Line 27, "skelton" should read --skeleton--.
Line 45, "skelton" should read --skeleton--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 30

Line 4, should read --wherein
$R_1$, $R_2$, $R_3$ and $R_4$ are independently

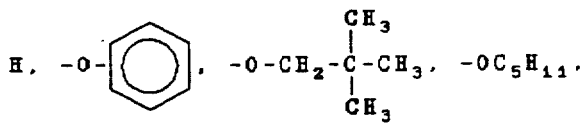

-OC($CH_3$) or -$CH_2NHC_3H_7$ and
M is $H_2$, Cu, Ni, Al-Cl or rare earth metal ion.--.

Line 10, "skelton" should read --skeleton--.
Line 28, "H Cu," should read --$H_2$, Cu--.
Line 31, "skelton" should read --skeleton--.
Line 56, "skelton" should read --skeleton--.

COLUMN 31

Line 3, "skelton" should read --skeleton--.
Line 16, "skelton" should read --skeleton--.
Line 32, "skelton" should read --skeleton--.
Line 48, "skelton" should read --skeleton--.
Line 53, "-CONH" should read -- -$CONH_2$--.
Line 58, "skelton" should read --skeleton--.
Line 68, "skelton" should read --skeleton--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 32

Line 9, "skelton" should read --skeleton--.
Line 24, "skelton" should read --skeleton--.
Line 38, "skelton" should read --skeleton-- and "formula:" should read --formula:

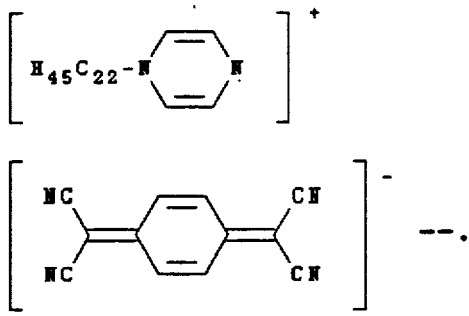

--.

Line 40, "ir" should read --or--.
Line 43, "skelton" should read --skeleton--.

COLUMN 33

Line 11, "skelton" should read --skeleton--.
Line 15, "skelton," should read --skeleton,--.
Line 48, "material a" should read --material is a--.
Line 49, "$\nu$ electron" should read --$\sigma$ electron--.
Line 55, "region" (both occurrences) should read --site--.

UNITED STATES PATENT AND TRADEMARK OFFICE
CERTIFICATE OF CORRECTION

PATENT NO. : 5,359,204
DATED : October 25, 1994
INVENTOR(S) : KEN EGUCHI, ET AL.

It is certified that error appears in the above-identified patent and that said Letters Patent is hereby corrected as shown below:

COLUMN 34

```
Line 16, "a" should read --an--.
Line 22, "claim 1" should read --claim 1,--.
Line 24, "claim 41" should read --claims 41,--.
Line 26, "claim 45" should read --claims 45,--.
Line 32, "of a" should read --of an--.
```

COLUMN 36

```
Line 23, "claim 1" should read --claim 1,--.
```

Signed and Sealed this

Eighteenth Day of April, 1995

Attest:

BRUCE LEHMAN

Attesting Officer

Commissioner of Patents and Trademarks